United States Patent
Gleason et al.

(10) Patent No.: US 7,893,704 B2
(45) Date of Patent: *Feb. 22, 2011

(54) MEMBRANE PROBING STRUCTURE WITH LATERALLY SCRUBBING CONTACTS

(75) Inventors: K. Reed Gleason, Portland, OR (US); Kenneth R. Smith, Portland, OR (US); Mike Bayne, Vancouver, WA (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.
This patent is subject to a terminal disclaimer.

(21) Appl. No.: 12/383,209

(22) Filed: Mar. 20, 2009

(65) Prior Publication Data
US 2009/0224783 A1    Sep. 10, 2009

Related U.S. Application Data

(63) Continuation of application No. 11/897,397, filed on Aug. 29, 2007, now Pat. No. 7,541,821, which is a continuation of application No. 11/441,673, filed on May 25, 2006, now Pat. No. 7,550,983, which is a continuation of application No. 11/155,986, filed on Jun. 17, 2005, now Pat. No. 7,109,731, which is a continuation of application No. 10/152,228, filed on May 20, 2002, now Pat. No. 6,927,585, which is a continuation of application No. 09/174,384, filed on Oct. 16, 1998, now Pat. No. 6,307,387, which is a continuation of application No. 08/695,077, filed on Aug. 8, 1996, now Pat. No. 5,914,613.

(51) Int. Cl.
*G01R 31/00* (2006.01)

(52) U.S. Cl. ............................. 324/755.01; 324/755.07

(58) Field of Classification Search ........................ None
See application file for complete search history.

(56) References Cited

U.S. PATENT DOCUMENTS

| | | | |
|---|---|---|---|
| 1,337,866 A | 4/1920 | Whitacker | |
| 2,142,625 A | 1/1939 | Zoethout | |

(Continued)

FOREIGN PATENT DOCUMENTS

CN    1 083 975    3/1994

(Continued)

OTHER PUBLICATIONS

Fink, Donald G., et. al., "Bridge Circuits, Detectors and Amplifiers—Principles of Bridge Measurements," Electronics Engineer's Handbook, First Edition, 1975, pp. 17-22-17-27, McGraw-Hill Book Company, New York.

(Continued)

*Primary Examiner*—Vinh P Nguyen
(74) *Attorney, Agent, or Firm*—Chernoff, Vilhauer, McClung & Stenzel

(57) ABSTRACT

A membrane probing assembly includes a support element having an incompressible forward support tiltably coupled to a rearward base and a membrane assembly, formed of polyimide layers, with its central region interconnected to the support by an elastomeric layer. Flexible traces form data/signal lines to contacts on the central region. Each contact comprises a rigid beam and a bump located in off-centered location on the beam, which bump includes a contacting portion. After initial touchdown of these contacting portions, further over-travel of the pads causes each beam to independently tilt locally so that different portions of each beam move different distances relative to the support thus driving each contact into lateral scrubbing movement across the pad thereby clearing away oxide buildup. The elastomeric member backed by the incompressible support ensures sufficient scrub pressure and reliable tilt recovery of each contact without mechanical straining of the beam. In an alternative embodiment, the contacts comprise conductive beams each supported on a loose U-shaped flap formed in the membrane assembly where each flap and beam is tiltably supported in inclined position by an elastomeric hub interposed between the flap and support.

34 Claims, 10 Drawing Sheets

U.S. PATENT DOCUMENTS

| | | |
|---|---|---|
| 2,376,101 A | 5/1945 | Tyzzer |
| 2,389,668 A | 11/1945 | Johnson |
| 3,176,091 A | 3/1965 | Hanson et al. |
| 3,193,712 A | 7/1965 | Harris |
| 3,230,299 A | 1/1966 | Radziekowski |
| 3,401,126 A | 9/1968 | Miller et al. |
| 3,429,040 A | 2/1969 | Miller |
| 3,441,315 A | 4/1969 | Paes et al. |
| 3,442,831 A | 5/1969 | Dickstein |
| 3,445,770 A | 5/1969 | Harmon |
| 3,484,679 A | 12/1969 | Hodgson et al. |
| 3,541,222 A | 11/1970 | Parks et al. |
| 3,595,228 A | 7/1971 | Simon |
| 3,596,228 A | 7/1971 | Reed, Jr. et al. |
| 3,609,539 A | 9/1971 | Gunthert |
| 3,634,807 A | 1/1972 | Grobe et al. |
| 3,654,585 A | 4/1972 | Wickersham |
| 3,680,037 A | 7/1972 | Nellis et al. |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,806,801 A | 4/1974 | Bove |
| 3,829,076 A | 8/1974 | Sofy |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,008,900 A | 2/1977 | Khoshaba |
| 4,027,935 A | 6/1977 | Byrnes et al. |
| 4,038,599 A | 7/1977 | Bove et al. |
| 4,038,894 A | 8/1977 | Knibbe et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,135,131 A | 1/1979 | Larsen et al. |
| 4,184,729 A | 1/1980 | Parks et al. |
| 4,275,446 A | 6/1981 | Blaess |
| 4,277,741 A | 7/1981 | Faxvog et al. |
| 4,284,033 A | 8/1981 | del Rio |
| 4,284,682 A | 8/1981 | Tshirch et al. |
| 4,287,473 A | 9/1981 | Sawyer |
| 4,312,117 A | 1/1982 | Robillard et al. |
| 4,327,180 A | 4/1982 | Chen |
| 4,330,783 A | 5/1982 | Toia |
| 4,357,575 A | 11/1982 | Uren et al. |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,552,033 A | 11/1985 | Marzhauser |
| 4,567,321 A | 1/1986 | Harayama |
| 4,581,679 A | 4/1986 | Smolley |
| 4,588,950 A | 5/1986 | Henley |
| 4,593,243 A | 6/1986 | Lao et al. |
| 4,621,169 A | 11/1986 | Petinelli et al. |
| 4,626,618 A | 12/1986 | Takaoka et al. |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,663,840 A | 5/1987 | Ubbens et al. |
| 4,673,839 A | 6/1987 | Veenendaal |
| 4,684,883 A | 8/1987 | Ackerman et al. |
| 4,691,163 A | 9/1987 | Blass et al. |
| 4,697,143 A | 9/1987 | Lockwood et al. |
| 4,705,447 A | 11/1987 | Smith |
| 4,707,657 A | 11/1987 | Bøegh-Peterson |
| 4,711,563 A | 12/1987 | Lass |
| 4,713,347 A | 12/1987 | Mitchell et al. |
| 4,725,793 A | 2/1988 | Igarashi |
| 4,727,391 A | 2/1988 | Tajima et al. |
| 4,727,637 A | 3/1988 | Buckwitz et al. |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,766,384 A | 8/1988 | Kleinberg et al. |
| 4,772,846 A | 9/1988 | Reeds |
| 4,780,670 A | 10/1988 | Cherry |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,812,754 A | 3/1989 | Tracy et al. |
| 4,827,211 A | 5/1989 | Strid et al. |
| 4,831,494 A | 5/1989 | Arnold et al. |
| 4,837,507 A | 6/1989 | Hechtman |
| 4,839,587 A | 6/1989 | Flatley et al. |
| 4,849,689 A | 7/1989 | Gleason et al. |
| 4,853,624 A | 8/1989 | Rabjohn |
| 4,853,627 A | 8/1989 | Gleason et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,891,584 A | 1/1990 | Kamieniecki et al. |
| 4,893,914 A | 1/1990 | Hancock et al. |
| 4,894,612 A | 1/1990 | Drake et al. |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,912,399 A | 3/1990 | Greub et al. |
| 4,916,002 A | 4/1990 | Carver |
| 4,916,398 A | 4/1990 | Rath |
| 4,918,383 A | 4/1990 | Huff et al. |
| 4,922,128 A | 5/1990 | Dhong et al. |
| 4,922,186 A | 5/1990 | Tsuchiya et al. |
| 4,922,192 A | 5/1990 | Gross et al. |
| 4,929,893 A | 5/1990 | Sato et al. |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,991,290 A | 2/1991 | MacKay |
| 4,998,062 A | 3/1991 | Ikeda |
| 5,001,423 A | 3/1991 | Abrami et al. |
| 5,003,253 A | 3/1991 | Majidi-Ahy et al. |

| | | | | | | |
|---|---|---|---|---|---|---|
| 5,020,219 A | 6/1991 | Leedy | | 5,389,885 A | 2/1995 | Swart |
| 5,021,186 A | 6/1991 | Ota et al. | | 5,395,253 A | 3/1995 | Crumly |
| 5,030,907 A | 7/1991 | Yih et al. | | 5,397,855 A | 3/1995 | Ferlier |
| 5,041,782 A | 8/1991 | Marzan | | 5,404,111 A | 4/1995 | Mori et al. |
| 5,045,781 A | 9/1991 | Gleason et al. | | 5,408,188 A | 4/1995 | Katoh |
| 5,059,898 A | 10/1991 | Barsotti et al. | | 5,408,189 A | 4/1995 | Swart et al. |
| 5,061,192 A | 10/1991 | Chapin et al. | | 5,412,330 A | 5/1995 | Ravel et al. |
| 5,061,823 A | 10/1991 | Carroll | | 5,412,866 A | 5/1995 | Woith et al. |
| 5,066,357 A | 11/1991 | Smyth, Jr. et al. | | 5,414,565 A | 5/1995 | Sullivan et al. |
| 5,069,628 A | 12/1991 | Crumly | | 5,422,574 A | 6/1995 | Kister |
| 5,082,627 A | 1/1992 | Stanbro | | 5,441,690 A | 8/1995 | Ayala-Esquilin et al. |
| 5,084,671 A | 1/1992 | Miyata et al. | | 5,451,722 A | 9/1995 | Gregoire |
| 5,089,774 A | 2/1992 | Nakano | | 5,451,884 A | 9/1995 | Sauerland |
| 5,091,692 A | 2/1992 | Ohno et al. | | 5,453,404 A | 9/1995 | Leedy |
| 5,091,732 A | 2/1992 | Mileski et al. | | 5,457,398 A | 10/1995 | Schwindt et al. |
| 5,095,891 A | 3/1992 | Reitter | | 5,467,024 A | 11/1995 | Swapp |
| 5,097,101 A | 3/1992 | Trobough | | 5,469,324 A | 11/1995 | Henderson et al. |
| 5,097,207 A | 3/1992 | Blanz | | 5,475,316 A | 12/1995 | Hurley et al. |
| 5,107,076 A | 4/1992 | Bullock et al. | | 5,476,211 A | 12/1995 | Khandros |
| 5,126,286 A | 6/1992 | Chance | | 5,477,011 A | 12/1995 | Singles et al. |
| 5,133,119 A | 7/1992 | Afshari et al. | | 5,478,748 A | 12/1995 | Akins, Jr. et al. |
| 5,134,365 A | 7/1992 | Okubo et al. | | 5,479,108 A | 12/1995 | Cheng |
| 5,136,237 A | 8/1992 | Smith et al. | | 5,479,109 A | 12/1995 | Lau et al. |
| 5,142,224 A | 8/1992 | Smith et al. | | 5,481,196 A | 1/1996 | Nosov |
| 5,145,552 A | 9/1992 | Yoshizawa et al. | | 5,481,936 A | 1/1996 | Yanagisawa |
| 5,148,103 A | 9/1992 | Pasiecznik, Jr. | | 5,487,999 A | 1/1996 | Farnworth |
| 5,159,264 A | 10/1992 | Anderson | | 5,488,954 A | 2/1996 | Sleva et al. |
| 5,159,267 A | 10/1992 | Anderson | | 5,493,070 A | 2/1996 | Habu |
| 5,159,752 A | 11/1992 | Mahant-Shetti et al. | | 5,493,236 A | 2/1996 | Ishii et al. |
| 5,160,883 A | 11/1992 | Blanz | | 5,500,606 A | 3/1996 | Holmes |
| 5,164,319 A | 11/1992 | Hafeman et al. | | 5,505,150 A | 4/1996 | James et al. |
| 5,166,606 A | 11/1992 | Blanz | | 5,506,498 A | 4/1996 | Anderson et al. |
| 5,172,049 A | 12/1992 | Kiyokawa et al. | | 5,506,515 A | 4/1996 | Godshalk et al. |
| 5,172,050 A | 12/1992 | Swapp | | 5,510,792 A | 4/1996 | Ono et al. |
| 5,172,051 A | 12/1992 | Zamborelli | | 5,511,010 A | 4/1996 | Burns |
| 5,177,438 A | 1/1993 | Littlebury et al. | | 5,512,835 A | 4/1996 | Rivera et al. |
| 5,180,977 A | 1/1993 | Huff | | 5,517,126 A | 5/1996 | Yamaguchi |
| 5,187,443 A | 2/1993 | Bereskin | | 5,521,518 A | 5/1996 | Higgins |
| 5,198,752 A | 3/1993 | Miyata et al. | | 5,521,522 A | 5/1996 | Abe et al. |
| 5,198,753 A | 3/1993 | Hamburgen | | 5,523,694 A | 6/1996 | Cole, Jr. |
| 5,202,558 A | 4/1993 | Barker | | 5,528,158 A | 6/1996 | Sinsheimer et al. |
| 5,207,585 A | 5/1993 | Byrnes et al. | | 5,530,372 A | 6/1996 | Lee et al. |
| 5,214,243 A | 5/1993 | Johnson | | 5,531,022 A | 7/1996 | Beaman et al. |
| 5,214,374 A | 5/1993 | St. Onge | | 5,532,608 A | 7/1996 | Behfar-Rad et al. |
| 5,225,037 A | 7/1993 | Elder et al. | | 5,537,372 A | 7/1996 | Albrecht et al. |
| 5,227,730 A | 7/1993 | King et al. | | 5,539,323 A | 7/1996 | Davis, Jr. |
| 5,232,789 A | 8/1993 | Platz et al. | | 5,539,676 A | 7/1996 | Yamaguchi |
| 5,233,197 A | 8/1993 | Bowman et al. | | 5,565,788 A | 10/1996 | Burr et al. |
| 5,233,306 A | 8/1993 | Misra | | 5,565,881 A | 10/1996 | Phillips et al. |
| 5,245,292 A | 9/1993 | Milesky et al. | | 5,569,591 A | 10/1996 | Kell et al. |
| 5,266,889 A | 11/1993 | Harwood et al. | | 5,571,324 A | 11/1996 | Sago et al. |
| 5,267,088 A | 11/1993 | Nomura | | 5,578,932 A | 11/1996 | Adamian |
| 5,270,664 A | 12/1993 | McMurtry et al. | | 5,583,445 A | 12/1996 | Mullen |
| 5,274,336 A | 12/1993 | Crook et al. | | 5,584,120 A | 12/1996 | Roberts |
| 5,280,156 A | 1/1994 | Niori et al. | | 5,584,608 A | 12/1996 | Gillespie |
| 5,293,175 A | 3/1994 | Hemmie et al. | | 5,589,781 A | 12/1996 | Higgins et al. |
| 5,298,972 A | 3/1994 | Heffner | | 5,600,256 A | 2/1997 | Woith et al. |
| 5,304,924 A | 4/1994 | Yamano et al. | | 5,601,740 A | 2/1997 | Eldrigde et al. |
| 5,313,157 A | 5/1994 | Pasiecznik, Jr. | | 5,610,529 A | 3/1997 | Schwindt |
| 5,315,237 A | 5/1994 | Iwakura et al. | | 5,617,035 A | 4/1997 | Swapp |
| 5,321,352 A | 6/1994 | Takebuchi | | 5,623,213 A | 4/1997 | Liu et al. |
| 5,321,453 A | 6/1994 | Mori et al. | | 5,623,214 A | 4/1997 | Pasiecznik, Jr. |
| 5,326,412 A | 7/1994 | Schreiber et al. | | 5,628,057 A | 5/1997 | Phillips et al. |
| 5,355,079 A | 10/1994 | Evans et al. | | 5,631,571 A | 5/1997 | Spaziani et al. |
| 5,357,211 A | 10/1994 | Bryson et al. | | 5,633,780 A | 5/1997 | Cronin |
| 5,363,050 A | 11/1994 | Guo et al. | | 5,634,267 A | 6/1997 | Farnworth et al. |
| 5,367,165 A | 11/1994 | Toda et al. | | 5,635,846 A | 6/1997 | Beaman et al. |
| 5,368,634 A | 11/1994 | Hackett | | 5,642,298 A | 6/1997 | Mallory et al. |
| 5,369,368 A | 11/1994 | Kassen et al. | | 5,644,248 A | 7/1997 | Fujimoto |
| 5,371,654 A | 12/1994 | Beaman et al. | | 5,653,939 A | 8/1997 | Hollis et al. |
| 5,373,231 A | 12/1994 | Boll et al. | | 5,656,942 A | 8/1997 | Watts et al. |
| 5,374,938 A | 12/1994 | Hatazawa et al. | | 5,659,421 A | 8/1997 | Rahmel et al. |
| 5,376,790 A | 12/1994 | Linker et al. | | 5,666,063 A | 9/1997 | Abercrombie et al. |

| | | | | | |
|---|---|---|---|---|---|
| 5,669,316 A | 9/1997 | Faz et al. | 5,912,046 A | 6/1999 | Eldridge et al. |
| 5,670,322 A | 9/1997 | Eggers et al. | 5,914,613 A | 6/1999 | Gleason et al. |
| 5,670,888 A | 9/1997 | Cheng | 5,914,614 A | 6/1999 | Beaman et al. |
| 5,672,816 A | 9/1997 | Park et al. | 5,916,689 A | 6/1999 | Collins et al. |
| 5,675,499 A | 10/1997 | Lee et al. | 5,917,707 A | 6/1999 | Khandros et al. |
| 5,675,932 A | 10/1997 | Mauney | 5,926,029 A | 7/1999 | Ference et al. |
| 5,676,360 A | 10/1997 | Boucher et al. | 5,926,951 A | 7/1999 | Khandros et al. |
| 5,685,232 A | 11/1997 | Inoue | 5,944,093 A | 8/1999 | Viswanath |
| 5,686,317 A | 11/1997 | Akram et al. | 5,945,836 A | 8/1999 | Sayre et al. |
| 5,700,844 A | 12/1997 | Hedrick et al. | 5,949,383 A | 9/1999 | Hayes et al. |
| 5,704,355 A | 1/1998 | Bridges | 5,949,579 A | 9/1999 | Baker |
| 5,715,819 A | 2/1998 | Svenson et al. | 5,959,461 A | 9/1999 | Brown et al. |
| 5,720,098 A | 2/1998 | Kister | 5,963,364 A | 10/1999 | Leong et al. |
| 5,723,347 A | 3/1998 | Hirano et al. | 5,970,429 A | 10/1999 | Martin |
| 5,726,211 A | 3/1998 | Hedrick et al. | 5,973,504 A | 10/1999 | Chong |
| 5,731,920 A | 3/1998 | Katsuragawa | 5,974,662 A | 11/1999 | Eldridge et al. |
| 5,742,174 A | 4/1998 | Kister et al. | 5,981,268 A | 11/1999 | Kovacs et al. |
| 5,744,383 A | 4/1998 | Fritz | 5,982,166 A | 11/1999 | Mautz |
| 5,744,971 A | 4/1998 | Chan et al. | 5,983,493 A | 11/1999 | Eldridge et al. |
| 5,748,506 A | 5/1998 | Bockelman | 5,990,695 A | 11/1999 | Daugherty, Jr. |
| 5,751,252 A | 5/1998 | Phillips | 5,993,611 A | 11/1999 | Moroney, III et al. |
| 5,756,021 A | 5/1998 | Hedrick et al. | 5,994,152 A | 11/1999 | Khandros et al. |
| 5,767,690 A | 6/1998 | Fujimoto | 5,995,914 A | 11/1999 | Cabot |
| 5,772,451 A | 6/1998 | Dozier, II et al. | 5,996,102 A | 11/1999 | Haulin |
| 5,773,780 A | 6/1998 | Eldridge et al. | 5,998,228 A | 12/1999 | Eldridge et al. |
| 5,777,485 A | 7/1998 | Tanaka et al. | 5,998,768 A | 12/1999 | Hunter et al. |
| 5,785,538 A | 7/1998 | Beaman et al. | 5,998,864 A | 12/1999 | Khandros et al. |
| 5,792,668 A | 8/1998 | Fuller et al. | 5,999,268 A | 12/1999 | Yonezawa et al. |
| 5,793,213 A | 8/1998 | Bockelman et al. | 6,001,760 A | 12/1999 | Katsuda et al. |
| 5,794,133 A | 8/1998 | Kashima | 6,002,426 A | 12/1999 | Back et al. |
| 5,804,607 A | 9/1998 | Hedrick et al. | 6,013,586 A | 1/2000 | McGhee et al. |
| 5,804,982 A | 9/1998 | Lo et al. | 6,019,612 A | 2/2000 | Hasegawa et al. |
| 5,804,983 A | 9/1998 | Nakajima et al. | 6,020,745 A | 2/2000 | Taraci |
| 5,806,181 A | 9/1998 | Khandros et al. | 6,023,103 A | 2/2000 | Chang et al. |
| 5,807,107 A | 9/1998 | Bright et al. | 6,028,435 A | 2/2000 | Nikawa |
| 5,810,607 A | 9/1998 | Shih et al. | 6,029,344 A | 2/2000 | Khandros et al. |
| 5,811,751 A | 9/1998 | Leong et al. | 6,031,383 A | 2/2000 | Streib et al. |
| 5,811,982 A | 9/1998 | Beaman et al. | 6,032,356 A | 3/2000 | Eldridge et al. |
| 5,813,847 A | 9/1998 | Eroglu et al. | 6,032,714 A | 3/2000 | Fenton |
| 5,814,847 A | 9/1998 | Shihadeh et al. | 6,033,935 A | 3/2000 | Dozier, II et al. |
| 5,820,014 A | 10/1998 | Dozier, II et al. | 6,034,533 A | 3/2000 | Tervo et al. |
| 5,821,763 A | 10/1998 | Beaman et al. | 6,037,785 A | 3/2000 | Higgins |
| 5,824,494 A | 10/1998 | Feldberg | 6,042,712 A | 3/2000 | Mathieu |
| 5,829,128 A | 11/1998 | Eldridge et al. | 6,043,563 A | 3/2000 | Eldridge et al. |
| 5,829,437 A | 11/1998 | Bridges | 6,049,216 A | 4/2000 | Yang et al. |
| 5,831,442 A | 11/1998 | Heigl | 6,049,976 A | 4/2000 | Khandros |
| 5,832,601 A | 11/1998 | Eldridge et al. | 6,050,829 A | 4/2000 | Eldridge et al. |
| 5,833,601 A | 11/1998 | Swartz et al. | 6,051,422 A | 4/2000 | Kovacs et al. |
| 5,838,160 A | 11/1998 | Beaman et al. | 6,052,653 A | 4/2000 | Mazur et al. |
| 5,841,288 A | 11/1998 | Meaney et al. | 6,054,651 A | 4/2000 | Fogel et al. |
| 5,846,708 A | 12/1998 | Hollis et al. | 6,054,869 A | 4/2000 | Hutton et al. |
| 5,847,569 A | 12/1998 | Ho et al. | 6,059,982 A | 5/2000 | Palagonia et al. |
| 5,848,500 A | 12/1998 | Kirk | 6,060,888 A | 5/2000 | Blackham et al. |
| 5,852,232 A | 12/1998 | Samsavar et al. | 6,060,892 A | 5/2000 | Yamagata |
| 5,854,608 A | 12/1998 | Leisten | 6,061,589 A | 5/2000 | Bridges et al. |
| 5,864,946 A | 2/1999 | Eldridge et al. | 6,062,879 A | 5/2000 | Beaman et al. |
| 5,867,073 A | 2/1999 | Weinreb et al. | 6,064,213 A | 5/2000 | Khandros et al. |
| 5,869,326 A | 2/1999 | Hofmann | 6,064,217 A | 5/2000 | Smith |
| 5,869,974 A | 2/1999 | Akram et al. | 6,064,218 A | 5/2000 | Godfrey et al. |
| 5,874,361 A | 2/1999 | Collins et al. | 6,066,911 A | 5/2000 | Lindemann et al. |
| 5,876,082 A | 3/1999 | Kempf et al. | 6,078,183 A | 6/2000 | Cole, Jr. |
| 5,878,486 A | 3/1999 | Eldridge et al. | 6,078,500 A | 6/2000 | Beaman et al. |
| 5,883,522 A | 3/1999 | O'Boyle | 6,090,261 A | 7/2000 | Mathieu |
| 5,883,523 A | 3/1999 | Ferland et al. | 6,091,236 A | 7/2000 | Piety et al. |
| 5,884,398 A | 3/1999 | Eldridge et al. | 6,091,255 A | 7/2000 | Godfrey |
| 5,888,075 A | 3/1999 | Hasegawa et al. | 6,096,567 A | 8/2000 | Kaplan et al. |
| 5,892,539 A | 4/1999 | Colvin | 6,100,815 A | 8/2000 | Pailthorp |
| 5,896,038 A | 4/1999 | Budnaitis et al. | 6,104,201 A | 8/2000 | Beaman et al. |
| 5,900,737 A | 5/1999 | Graham et al. | 6,104,206 A | 8/2000 | Verkuil |
| 5,900,738 A | 5/1999 | Khandros et al. | 6,110,823 A | 8/2000 | Eldridge et al. |
| 5,903,143 A | 5/1999 | Mochizuki et al. | 6,114,864 A | 9/2000 | Soejima et al. |
| 5,905,421 A | 5/1999 | Oldfield | 6,114,865 A | 9/2000 | Lagowski et al. |
| 5,910,727 A | 6/1999 | Fujihara et al. | 6,118,287 A | 9/2000 | Boll et al. |

| Patent | Kind | Date | Inventor |
|---|---|---|---|
| 6,118,894 | A | 9/2000 | Schwartz et al. |
| 6,124,725 | A | 9/2000 | Sato |
| 6,127,831 | A | 10/2000 | Khoury et al. |
| 6,137,302 | A | 10/2000 | Schwindt |
| 6,144,212 | A | 11/2000 | Mizuta |
| 6,147,502 | A | 11/2000 | Fryer et al. |
| 6,147,851 | A | 11/2000 | Anderson |
| 6,150,186 | A | 11/2000 | Chen et al. |
| 6,160,407 | A | 12/2000 | Nikawa |
| 6,160,412 | A | 12/2000 | Martel et al. |
| 6,166,333 | A | 12/2000 | Crumly et al. |
| 6,166,553 | A | 12/2000 | Sinsheimer |
| 6,168,974 | B1 | 1/2001 | Chang et al. |
| 6,169,410 | B1 | 1/2001 | Grace et al. |
| 6,172,337 | B1 | 1/2001 | Johnsgard et al. |
| 6,174,744 | B1 | 1/2001 | Watanabe et al. |
| 6,175,228 | B1 | 1/2001 | Zamborelli et al. |
| 6,176,091 | B1 | 1/2001 | Kishi et al. |
| 6,181,144 | B1 | 1/2001 | Hembree et al. |
| 6,181,149 | B1 | 1/2001 | Godfrey et al. |
| 6,181,297 | B1 | 1/2001 | Leisten |
| 6,181,416 | B1 | 1/2001 | Falk |
| 6,184,053 | B1 | 2/2001 | Eldridge et al. |
| 6,184,587 | B1 | 2/2001 | Khandros et al. |
| 6,184,845 | B1 | 2/2001 | Leisten et al. |
| 6,191,596 | B1 | 2/2001 | Abiko |
| 6,194,720 | B1 | 2/2001 | Li et al. |
| 6,206,273 | B1 | 3/2001 | Beaman et al. |
| 6,208,225 | B1 | 3/2001 | Miller |
| 6,211,663 | B1 | 4/2001 | Moulthrop et al. |
| 6,211,837 | B1 | 4/2001 | Crouch et al. |
| 6,215,196 | B1 | 4/2001 | Eldridge et al. |
| 6,215,295 | B1 | 4/2001 | Smith, III |
| 6,215,670 | B1 | 4/2001 | Khandros |
| 6,218,910 | B1 | 4/2001 | Miller |
| 6,222,031 | B1 | 4/2001 | Wakabayashi et al. |
| 6,229,327 | B1 | 5/2001 | Boll et al. |
| 6,232,149 | B1 | 5/2001 | Dozier, II et al. |
| 6,232,787 | B1 | 5/2001 | Lo et al. |
| 6,232,788 | B1 | 5/2001 | Schwindt et al. |
| 6,233,613 | B1 | 5/2001 | Walker et al. |
| 6,236,223 | B1 | 5/2001 | Brady et al. |
| 6,242,803 | B1 | 6/2001 | Khandros et al. |
| 6,242,929 | B1 | 6/2001 | Mizuta |
| 6,245,692 | B1 | 6/2001 | Pearce et al. |
| 6,246,247 | B1 | 6/2001 | Eldridge et al. |
| 6,251,595 | B1 | 6/2001 | Gordon et al. |
| 6,255,126 | B1 | 7/2001 | Mathieu et al. |
| 6,256,882 | B1 | 7/2001 | Gleason et al. |
| 6,257,564 | B1 | 7/2001 | Avneri et al. |
| 6,265,950 | B1 | 7/2001 | Schmidt et al. |
| 6,268,015 | B1 | 7/2001 | Mathieu et al. |
| 6,268,016 | B1 | 7/2001 | Bhatt et al. |
| 6,271,673 | B1 | 8/2001 | Furuta et al. |
| 6,274,823 | B1 | 8/2001 | Khandros et al. |
| 6,275,738 | B1 | 8/2001 | Kasevich et al. |
| 6,278,051 | B1 | 8/2001 | Peabody |
| 6,278,411 | B1 | 8/2001 | Ohlsson et al. |
| 6,281,691 | B1 | 8/2001 | Matsunaga et al. |
| 6,286,208 | B1 | 9/2001 | Shih et al. |
| 6,292,760 | B1 | 9/2001 | Burns |
| 0,030,549 | A1 | 10/2001 | Gleason, et. al. |
| 6,295,729 | B1 | 10/2001 | Beaman et al. |
| 6,300,775 | B1 | 10/2001 | Peach et al. |
| 6,300,780 | B1 | 10/2001 | Beaman et al. |
| 6,307,161 | B1 | 10/2001 | Grube et al. |
| 6,307,387 | B1 | 10/2001 | Gleason et al. |
| 6,307,672 | B1 | 10/2001 | DeNure |
| 6,310,483 | B1 | 10/2001 | Taura et al. |
| 6,320,372 | B1 | 11/2001 | Keller |
| 6,320,396 | B1 | 11/2001 | Nikawa |
| 6,327,034 | B1 | 12/2001 | Hoover et al. |
| 6,329,827 | B1 | 12/2001 | Beaman et al. |
| 6,330,164 | B1 | 12/2001 | Khandros et al. |
| 6,332,270 | B2 | 12/2001 | Beaman et al. |
| 6,334,247 | B1 | 1/2002 | Beaman et al. |
| 6,335,625 | B1 | 1/2002 | Bryant et al. |
| 6,339,338 | B1 | 1/2002 | Eldridge et al. |
| 6,340,568 | B2 | 1/2002 | Hefti |
| 6,340,895 | B1 | 1/2002 | Uher et al. |
| 6,351,885 | B2 | 3/2002 | Suzuki et al. |
| 6,352,454 | B1 | 3/2002 | Kim et al. |
| 6,359,456 | B1 | 3/2002 | Hembree et al. |
| 6,362,792 | B1 | 3/2002 | Sawamura et al. |
| 6,366,247 | B1 | 4/2002 | Sawamura et al. |
| 6,369,776 | B1 | 4/2002 | Leisten et al. |
| 6,376,258 | B2 | 4/2002 | Hefti |
| 6,384,614 | B1 | 5/2002 | Hager et al. |
| 6,395,480 | B1 | 5/2002 | Hefti |
| 6,396,296 | B1 | 5/2002 | Tartar et al. |
| 6,396,298 | B1 | 5/2002 | Young et al. |
| 6,400,168 | B2 | 6/2002 | Matsunaga et al. |
| 6,404,211 | B2 | 6/2002 | Hamel et al. |
| 6,404,213 | B2 | 6/2002 | Noda |
| 6,407,562 | B1 | 6/2002 | Whiteman |
| 6,409,724 | B1 | 6/2002 | Penny et al. |
| 6,414,478 | B1 | 7/2002 | Suzuki |
| 6,415,858 | B1 | 7/2002 | Getchel et al. |
| 6,418,009 | B1 | 7/2002 | Brunette |
| 6,419,500 | B1 | 7/2002 | Kister |
| 6,420,722 | B2 | 7/2002 | Moore et al. |
| 6,420,887 | B1 | 7/2002 | Kister et al. |
| 6,424,164 | B1 | 7/2002 | Kister |
| 6,424,316 | B1 | 7/2002 | Leisten et al. |
| 6,429,029 | B1 | 8/2002 | Eldridge et al. |
| 6,441,315 | B1 | 8/2002 | Eldridge et al. |
| 6,442,831 | B1 | 9/2002 | Khandros et al. |
| 6,447,339 | B1 | 9/2002 | Reed et al. |
| 6,448,788 | B1 | 9/2002 | Meaney et al. |
| 6,448,865 | B1 | 9/2002 | Miller |
| 6,452,406 | B1 | 9/2002 | Beaman et al. |
| 6,452,411 | B1 | 9/2002 | Miller et al. |
| 6,456,099 | B1 | 9/2002 | Eldridge et al. |
| 6,456,103 | B1 | 9/2002 | Eldridge et al. |
| 6,459,343 | B1 | 10/2002 | Miller |
| 6,459,739 | B1 | 10/2002 | Vitenberg |
| 6,468,098 | B1 | 10/2002 | Eldridge |
| 6,475,822 | B2 | 11/2002 | Eldridge et al. |
| 6,476,333 | B1 | 11/2002 | Khandros et al. |
| 6,476,442 | B1 | 11/2002 | Williams et al. |
| 6,476,630 | B1 | 11/2002 | Whitten et al. |
| 6,479,308 | B1 | 11/2002 | Eldridge |
| 6,480,013 | B1 | 11/2002 | Nayler et al. |
| 6,480,978 | B1 | 11/2002 | Roy et al. |
| 6,481,939 | B1 | 11/2002 | Gillespie et al. |
| 6,482,013 | B2 | 11/2002 | Eldridge et al. |
| 6,483,327 | B1 | 11/2002 | Bruce et al. |
| 6,488,405 | B1 | 12/2002 | Eppes et al. |
| 6,490,471 | B2 | 12/2002 | Svenson et al. |
| 6,491,968 | B1 | 12/2002 | Mathieu et al. |
| 6,499,121 | B1 | 12/2002 | Roy et al. |
| 6,501,343 | B2 | 12/2002 | Miller |
| 6,509,751 | B1 | 1/2003 | Mathieu |
| 6,512,482 | B1 | 1/2003 | Nelson et al. |
| 6,520,778 | B1 | 2/2003 | Eldridge et al. |
| 6,525,552 | B2 | 2/2003 | Kister |
| 6,525,555 | B1 | 2/2003 | Khandros et al. |
| 6,526,655 | B2 | 3/2003 | Beaman et al. |
| 6,528,984 | B2 | 3/2003 | Beaman et al. |
| 6,528,993 | B1 | 3/2003 | Shin et al. |
| 6,529,844 | B1 | 3/2003 | Kapetanic et al. |
| 6,530,148 | B1 | 3/2003 | Kister |
| 6,534,856 | B1 | 3/2003 | Dozier, II et al. |
| 6,538,214 | B2 | 3/2003 | Khandros |
| 6,538,538 | B2 | 3/2003 | Hreish et al. |
| 6,539,531 | B2 | 3/2003 | Miller et al. |

| | | | | | | |
|---|---|---|---|---|---|---|
| 6,548,311 | B1 | 4/2003 | Knoll | 6,727,716 | B1 | 4/2004 | Sharif |
| 6,549,022 | B1 | 4/2003 | Cole, Jr. et al. | 6,729,019 | B2 | 5/2004 | Grube et al. |
| 6,549,106 | B2 | 4/2003 | Martin | 6,731,804 | B1 | 5/2004 | Carrieri et al. |
| 6,551,884 | B2 | 4/2003 | Masuoka | 6,734,687 | B1 | 5/2004 | Ishitani et al. |
| 6,559,671 | B2 | 5/2003 | Miller et al. | 6,737,920 | B2 | 5/2004 | Jen et al. |
| 6,566,079 | B2 | 5/2003 | Hefti | 6,741,085 | B1 | 5/2004 | Khandros et al. |
| 6,573,702 | B2 | 6/2003 | Marcuse et al. | 6,741,092 | B2 | 5/2004 | Eldridge et al. |
| 6,578,264 | B1 | 6/2003 | Gleason et al. | 6,744,268 | B2 | 6/2004 | Hollman |
| 6,580,283 | B1 | 6/2003 | Carbone et al. | 6,753,679 | B1 | 6/2004 | Kwong et al. |
| 6,582,979 | B2 | 6/2003 | Coccioli et al. | 6,753,699 | B2 | 6/2004 | Stockstad |
| 6,586,956 | B2 | 7/2003 | Aldaz et al. | 6,759,311 | B2 | 7/2004 | Eldridge et al. |
| 6,587,327 | B1 | 7/2003 | Devoe et al. | 6,764,869 | B2 | 7/2004 | Eldridge |
| 6,597,187 | B2 | 7/2003 | Eldridge et al. | 6,768,328 | B2 | 7/2004 | Self et al. |
| 6,603,322 | B1 | 8/2003 | Boll et al. | 6,770,955 | B1 | 8/2004 | Coccioli et al. |
| 6,603,323 | B1 | 8/2003 | Miller et al. | 6,771,806 | B1 | 8/2004 | Satya et al. |
| 6,603,324 | B2 | 8/2003 | Eldridge et al. | 6,777,319 | B2 | 8/2004 | Grube et al. |
| 6,605,951 | B1 | 8/2003 | Cowan | 6,778,140 | B1 | 8/2004 | Yeh |
| 6,605,955 | B1 | 8/2003 | Costello et al. | 6,778,406 | B2 | 8/2004 | Eldridge et al. |
| 6,606,014 | B2 | 8/2003 | Miller | 6,780,001 | B2 | 8/2004 | Eldridge et al. |
| 6,606,575 | B2 | 8/2003 | Miller | 6,784,674 | B2 | 8/2004 | Miller |
| 6,608,494 | B1 | 8/2003 | Bruce et al. | 6,784,677 | B2 | 8/2004 | Miller et al. |
| 6,611,417 | B2 | 8/2003 | Chen | 6,784,679 | B2 | 8/2004 | Sweet et al. |
| 6,615,485 | B2 | 9/2003 | Eldridge et al. | 6,788,093 | B2 | 9/2004 | Aitren et al. |
| 6,616,966 | B2 | 9/2003 | Mathieu et al. | 6,788,094 | B2 | 9/2004 | Khandros et al. |
| 6,617,862 | B1 | 9/2003 | Bruce | 6,791,176 | B2 | 9/2004 | Mathieu et al. |
| 6,621,082 | B2 | 9/2003 | Morita et al. | 6,794,888 | B2 | 9/2004 | Kawaguchi et al. |
| 6,621,260 | B2 | 9/2003 | Eldridge et al. | 6,794,950 | B2 | 9/2004 | Du Toit et al. |
| 6,622,103 | B1 | 9/2003 | Miller | 6,798,225 | B2 | 9/2004 | Miller |
| 6,624,648 | B2 | 9/2003 | Eldridge et al. | 6,798,226 | B2 | 9/2004 | Altman et al. |
| 6,627,461 | B2 | 9/2003 | Chapman et al. | 6,806,724 | B2 | 10/2004 | Hayden et al. |
| 6,627,483 | B2 | 9/2003 | Ondricek et al. | 6,806,836 | B2 | 10/2004 | Ogawa et al. |
| 6,627,980 | B2 | 9/2003 | Eldridge | 6,807,734 | B2 | 10/2004 | Eldridge et al. |
| 6,628,503 | B2 | 9/2003 | Sogard | 6,809,533 | B1 | 10/2004 | Anlage et al. |
| 6,628,980 | B2 | 9/2003 | Atalar et al. | 6,811,406 | B2 | 11/2004 | Grube |
| 6,633,174 | B1 | 10/2003 | Satya et al. | 6,812,691 | B2 | 11/2004 | Miller |
| 6,636,182 | B2 | 10/2003 | Mehltretter | 6,812,718 | B1 | 11/2004 | Chong et al. |
| 6,639,461 | B1 | 10/2003 | Tam et al. | 6,815,963 | B2 | 11/2004 | Gleason et al. |
| 6,640,415 | B2 | 11/2003 | Eslamy et al. | 6,816,031 | B1 | 11/2004 | Miller |
| 6,640,432 | B1 | 11/2003 | Mathieu et al. | 6,817,052 | B2 | 11/2004 | Grube |
| 6,642,625 | B2 | 11/2003 | Dozier, II et al. | 6,818,840 | B2 | 11/2004 | Khandros |
| 6,643,597 | B1 | 11/2003 | Dunsmore | 6,822,463 | B1 | 11/2004 | Jacobs |
| 6,644,982 | B1 | 11/2003 | Ondricek et al. | 6,822,529 | B2 | 11/2004 | Miller |
| 6,646,520 | B2 | 11/2003 | Miller | 6,825,052 | B2 | 11/2004 | Eldridge et al. |
| 6,653,903 | B2 | 11/2003 | Leich et al. | 6,825,422 | B2 | 11/2004 | Eldridge et al. |
| 6,655,023 | B1 | 12/2003 | Eldridge et al. | 6,827,584 | B2 | 12/2004 | Mathieu et al. |
| 6,657,455 | B2 | 12/2003 | Eldridge et al. | 6,835,898 | B2 | 12/2004 | Eldridge et al. |
| 6,657,601 | B2 | 12/2003 | McLean | 6,836,962 | B2 | 1/2005 | Khandros et al. |
| 6,661,316 | B2 | 12/2003 | Hreish et al. | 6,838,885 | B2 | 1/2005 | Kamitani |
| 6,664,628 | B2 | 12/2003 | Khandros et al. | 6,838,890 | B2 | 1/2005 | Tervo et al. |
| 6,669,489 | B1 | 12/2003 | Dozier, II et al. | 6,839,964 | B2 | 1/2005 | Henson |
| 6,672,875 | B1 | 1/2004 | Mathieu et al. | 6,845,491 | B2 | 1/2005 | Miller et al. |
| 6,677,744 | B1 | 1/2004 | Long | 6,856,129 | B2 | 2/2005 | Thomas et al. |
| 6,678,850 | B2 | 1/2004 | Roy et al. | 6,856,150 | B2 | 2/2005 | Sporck et al. |
| 6,678,876 | B2 | 1/2004 | Stevens et al. | 6,860,009 | B2 | 3/2005 | Gleason et al. |
| 6,680,659 | B2 | 1/2004 | Miller | 6,862,727 | B2 | 3/2005 | Stevens |
| 6,685,817 | B1 | 2/2004 | Mathieu | 6,864,105 | B2 | 3/2005 | Grube et al. |
| 6,686,754 | B2 | 2/2004 | Miller | 6,864,694 | B2 | 3/2005 | McTigue |
| 6,690,185 | B1 | 2/2004 | Khandros et al. | 6,870,381 | B2 | 3/2005 | Grube |
| 6,701,265 | B2 | 3/2004 | Hill et al. | 6,882,239 | B2 | 4/2005 | Miller |
| 6,701,612 | B2 | 3/2004 | Khandros et al. | 6,882,546 | B2 | 4/2005 | Miller |
| 6,707,548 | B2 | 3/2004 | Kreimer et al. | 6,887,723 | B1 | 5/2005 | Ondricek et al. |
| 6,708,386 | B2 | 3/2004 | Gleason et al. | 6,888,362 | B2 | 5/2005 | Eldridge et al. |
| 6,708,403 | B2 | 3/2004 | Beaman et al. | 6,891,385 | B2 | 5/2005 | Miller |
| 6,710,798 | B1 | 3/2004 | Hershel et al. | 6,900,646 | B2 | 5/2005 | Kasukabe et al. |
| 6,713,374 | B2 | 3/2004 | Eldridge et al. | 6,900,652 | B2 | 5/2005 | Mazur |
| 6,714,828 | B2 | 3/2004 | Eldridge et al. | 6,900,653 | B2 | 5/2005 | Yu et al. |
| 6,717,426 | B2 | 4/2004 | Iwasaki | 6,902,416 | B2 | 6/2005 | Feldman |
| 6,720,501 | B1 | 4/2004 | Henson | 6,902,941 | B2 | 6/2005 | Sun |
| 6,722,032 | B2 | 4/2004 | Beaman et al. | 6,903,563 | B2 | 6/2005 | Yoshida et al. |
| 6,724,205 | B1 | 4/2004 | Hayden et al. | 6,906,506 | B1 | 6/2005 | Reano et al. |
| 6,724,928 | B2 | 4/2004 | Davis | 6,906,539 | B2 | 6/2005 | Wilson et al. |
| 6,727,579 | B1 | 4/2004 | Eldridge et al. | 6,906,542 | B2 | 6/2005 | Sakagawa et al. |
| 6,727,580 | B1 | 4/2004 | Eldridge et al. | 6,906,543 | B2 | 6/2005 | Lou et al. |

| Patent | Type | Date | Name |
|---|---|---|---|
| 6,907,149 | B2 | 6/2005 | Slater |
| 6,908,364 | B2 | 6/2005 | Back et al. |
| 6,909,297 | B2 | 6/2005 | Ji et al. |
| 6,909,300 | B2 | 6/2005 | Lu et al. |
| 6,909,983 | B2 | 6/2005 | Sutherland |
| 6,910,268 | B2 | 6/2005 | Miller |
| 6,911,814 | B2 | 6/2005 | Miller et al. |
| 6,911,826 | B2 | 6/2005 | Plotnikov et al. |
| 6,911,834 | B2 | 6/2005 | Mitchell et al. |
| 6,911,835 | B2 | 6/2005 | Chraft et al. |
| 6,912,468 | B2 | 6/2005 | Marin et al. |
| 6,913,468 | B2 | 7/2005 | Dozier, II et al. |
| 6,914,244 | B2 | 7/2005 | Alani |
| 6,914,427 | B2 | 7/2005 | Gifford et al. |
| 6,914,430 | B2 | 7/2005 | Hasegawa et al. |
| 6,914,580 | B2 | 7/2005 | Leisten |
| 6,917,195 | B2 | 7/2005 | Hollman |
| 6,917,210 | B2 | 7/2005 | Miller |
| 6,917,211 | B2 | 7/2005 | Yoshida et al. |
| 6,917,525 | B2 | 7/2005 | Mok et al. |
| 6,917,732 | B2 | 7/2005 | Miyata et al. |
| 6,919,732 | B2 | 7/2005 | Yoshida et al. |
| 6,922,069 | B2 | 7/2005 | Jun |
| 6,924,653 | B2 | 8/2005 | Schaeffer et al. |
| 6,924,655 | B2 | 8/2005 | Kirby |
| 6,927,078 | B2 | 8/2005 | Saijyo et al. |
| 6,927,079 | B1 | 8/2005 | Fyfield |
| 6,927,586 | B2 | 8/2005 | Thiessen |
| 6,927,587 | B2 | 8/2005 | Yoshioka |
| 6,927,598 | B2 | 8/2005 | Lee et al. |
| 6,930,498 | B2 | 8/2005 | Tervo et al. |
| 6,933,713 | B2 | 8/2005 | Cannon |
| 6,933,717 | B1 | 8/2005 | Dogaru et al. |
| 6,933,725 | B2 | 8/2005 | Lim et al. |
| 6,933,736 | B2 | 8/2005 | Kobayashi et al. |
| 6,933,737 | B2 | 8/2005 | Sugawara |
| 6,937,020 | B2 | 8/2005 | Munson et al. |
| 6,937,037 | B2 | 8/2005 | Eldridge et al. |
| 6,937,039 | B2 | 8/2005 | Barr et al. |
| 6,937,040 | B2 | 8/2005 | Maeda et al. |
| 6,937,042 | B2 | 8/2005 | Yoshida et al. |
| 6,937,045 | B2 | 8/2005 | Sinclair |
| 6,937,341 | B1 | 8/2005 | Woollam et al. |
| 6,940,264 | B2 | 9/2005 | Ryken, Jr. et al. |
| 6,940,283 | B2 | 9/2005 | McQueeney |
| 6,943,563 | B2 | 9/2005 | Martens |
| 6,943,571 | B2 | 9/2005 | Worledge |
| 6,943,574 | B2 | 9/2005 | Actmann et al. |
| 6,944,380 | B1 | 9/2005 | Hideo et al. |
| 6,946,375 | B2 | 9/2005 | Hattori et al. |
| 6,946,859 | B2 | 9/2005 | Karavakis et al. |
| 6,946,860 | B2 | 9/2005 | Cheng |
| 6,948,391 | B2 | 9/2005 | Brassell et al. |
| 6,948,981 | B2 | 9/2005 | Pade |
| 6,970,001 | B2 | 11/2005 | Chheda et al. |
| 6,987,483 | B2 | 1/2006 | Tran |
| 7,001,785 | B1 | 2/2006 | Chen |
| 7,002,133 | B2 | 2/2006 | Beausoleil et al. |
| 7,002,363 | B2 | 2/2006 | Mathieu |
| 7,002,364 | B2 | 2/2006 | Kang et al. |
| 7,003,184 | B2 | 2/2006 | Ronnekliev et al. |
| 7,005,842 | B2 | 2/2006 | Fink et al. |
| 7,005,868 | B2 | 2/2006 | McTigue |
| 7,005,879 | B1 | 2/2006 | Robertazzi |
| 7,006,046 | B2 | 2/2006 | Aisenbrey |
| 7,007,380 | B2 | 3/2006 | Das et al. |
| 7,009,188 | B2 | 3/2006 | Wang |
| 7,009,383 | B2 | 3/2006 | Harwood et al. |
| 7,009,415 | B2 | 3/2006 | Kobayashi et al. |
| 7,011,531 | B2 | 3/2006 | Egitto et al. |
| 7,012,425 | B2 | 3/2006 | Shoji |
| 7,012,441 | B2 | 3/2006 | Chou et al. |
| 7,013,221 | B1 | 3/2006 | Friend et al. |
| 7,014,499 | B2 | 3/2006 | Yoon |
| 7,015,455 | B2 | 3/2006 | Mitsuoka et al. |
| 7,015,689 | B2 | 3/2006 | Kasajima et al. |
| 7,015,690 | B2 | 3/2006 | Wang et al. |
| 7,015,703 | B2 | 3/2006 | Hopkins et al. |
| 7,015,707 | B2 | 3/2006 | Cherian |
| 7,015,708 | B2 | 3/2006 | Beckous et al. |
| 7,015,709 | B2 | 3/2006 | Capps et al. |
| 7,015,710 | B2 | 3/2006 | Yoshida et al. |
| 7,015,711 | B2 | 3/2006 | Rothaug et al. |
| 7,019,541 | B2 | 3/2006 | Kittrell |
| 7,019,544 | B1 | 3/2006 | Jacobs et al. |
| 7,019,701 | B2 | 3/2006 | Ohno et al. |
| 7,020,360 | B2 | 3/2006 | Satomura et al. |
| 7,020,363 | B2 | 3/2006 | Johannessen |
| 7,022,976 | B1 | 4/2006 | Santana, Jr. et al. |
| 7,022,985 | B2 | 4/2006 | Knebel et al. |
| 7,023,225 | B2 | 4/2006 | Blackwood |
| 7,023,226 | B2 | 4/2006 | Okumura et al. |
| 7,023,231 | B2 | 4/2006 | Howland, Jr. et al. |
| 7,025,628 | B2 | 4/2006 | LaMeres et al. |
| 7,026,832 | B2 | 4/2006 | Chaya et al. |
| 7,026,833 | B2 | 4/2006 | Rincon et al. |
| 7,026,834 | B2 | 4/2006 | Hwang |
| 7,026,835 | B2 | 4/2006 | Farnworth et al. |
| 7,030,599 | B2 | 4/2006 | Douglas |
| 7,030,827 | B2 | 4/2006 | Mahler et al. |
| 7,032,307 | B2 | 4/2006 | Matsunaga et al. |
| 7,034,553 | B2 | 4/2006 | Gilboe |
| 7,035,738 | B2 | 4/2006 | Matsumoto et al. |
| 7,088,981 | B2 | 8/2006 | Chang |
| 7,096,133 | B1 | 8/2006 | Martin et al. |
| 7,148,711 | B2 | 12/2006 | Tervo et al. |
| 7,187,188 | B2 | 3/2007 | Andrews et al. |
| 7,188,037 | B2 | 3/2007 | Hidehira |
| 7,266,889 | B2 | 9/2007 | Gleason et al. |
| 7,292,055 | B2 * | 11/2007 | Egitto et al. ................ 324/754 |
| 7,368,927 | B2 | 5/2008 | Smith et al. |
| 2001/0002794 | A1 | 6/2001 | Draving et al. |
| 2001/0009061 | A1 | 7/2001 | Gleason et al. |
| 2001/0009377 | A1 | 7/2001 | Schwindt et al. |
| 2001/0010468 | A1 | 8/2001 | Gleason et al. |
| 2001/0020283 | A1 | 9/2001 | Sakaguchi |
| 2001/0024116 | A1 | 9/2001 | Draving |
| 2001/0030549 | A1 | 10/2001 | Gleason et al. |
| 2001/0043073 | A1 | 11/2001 | Montoya |
| 2001/0044152 | A1 | 11/2001 | Burnett |
| 2001/0045511 | A1 | 11/2001 | Moore et al. |
| 2001/0054906 | A1 | 12/2001 | Fujimura |
| 2002/0005728 | A1 | 1/2002 | Babson et al. |
| 2002/0008533 | A1 | 1/2002 | Ito et al. |
| 2002/0009377 | A1 | 1/2002 | Shafer |
| 2002/0009378 | A1 | 1/2002 | Obara |
| 2002/0011859 | A1 | 1/2002 | Smith et al. |
| 2002/0011863 | A1 | 1/2002 | Takahashi et al. |
| 2002/0050828 | A1 | 5/2002 | Seward, IV et al. |
| 2002/0070743 | A1 | 6/2002 | Felici et al. |
| 2002/0070745 | A1 | 6/2002 | Johnson et al. |
| 2002/0079911 | A1 | 6/2002 | Schwindt |
| 2002/0109514 | A1 | 8/2002 | Brandorff et al. |
| 2002/0118034 | A1 | 8/2002 | Laureanti |
| 2002/0149377 | A1 | 10/2002 | Hefti et al. |
| 2002/0153909 | A1 | 10/2002 | Petersen et al. |
| 2002/0163769 | A1 | 11/2002 | Brown |
| 2002/0168659 | A1 | 11/2002 | Hefti et al. |
| 2002/0180466 | A1 | 12/2002 | Hiramatsu et al. |
| 2002/0197709 | A1 | 12/2002 | van der Weide et al. |
| 2003/0010877 | A1 | 1/2003 | Landreville et al. |
| 2003/0030822 | A1 | 2/2003 | Finarov |
| 2003/0032000 | A1 | 2/2003 | Liu et al. |
| 2003/0040004 | A1 | 2/2003 | Hefti et al. |
| 2003/0057513 | A1 | 3/2003 | Leedy |
| 2003/0057957 | A1 | 3/2003 | McQuade et al. |

| | | | | | | |
|---|---|---|---|---|---|---|
| 2003/0062915 | A1 | 4/2003 | Arnold et al. | JP | 56-007439 | 1/1981 |
| 2003/0072549 | A1 | 4/2003 | Facer et al. | JP | 56-88333 | 7/1981 |
| 2003/0077649 | A1 | 4/2003 | Cho et al. | JP | 57-075480 | 5/1982 |
| 2003/0088180 | A1 | 5/2003 | vanVeen et al. | JP | 57-163035 | 10/1982 |
| 2003/0119057 | A1 | 6/2003 | Gascoyne et al. | JP | 62-11243 | 1/1987 |
| 2003/0139662 | A1 | 7/2003 | Seidman | JP | 62-51235 | 3/1987 |
| 2003/0139790 | A1 | 7/2003 | Ingle et al. | JP | 62-098634 | 5/1987 |
| 2003/0155939 | A1 | 8/2003 | Lutz et al. | JP | 62-107937 | 5/1987 |
| 2003/0170898 | A1 | 9/2003 | Gunderson et al. | JP | 62-239050 | 10/1987 |
| 2003/0184332 | A1 | 10/2003 | Tomimatsu et al. | JP | 63-108736 | 5/1988 |
| 2004/0015060 | A1 | 1/2004 | Samsoondar et al. | JP | 63-129640 | 6/1988 |
| 2004/0021475 | A1 | 2/2004 | Ito et al. | JP | 63-143814 | 6/1988 |
| 2004/0061514 | A1 | 4/2004 | Schwindt et al. | JP | 63-318745 | 12/1988 |
| 2004/0066181 | A1 | 4/2004 | Thies | JP | 1-165968 | 6/1989 |
| 2004/0069776 | A1 | 4/2004 | Fagrell et al. | JP | 1-214038 | 8/1989 |
| 2004/0090223 | A1 | 5/2004 | Yonezawa | JP | 1-219575 | 9/1989 |
| 2004/0095145 | A1 | 5/2004 | Boudiaf et al. | JP | 1-296167 | 11/1989 |
| 2004/0095641 | A1 | 5/2004 | Russum et al. | JP | 2-22836 | 1/1990 |
| 2004/0100276 | A1 | 5/2004 | Fanton | JP | 2-124469 | 5/1990 |
| 2004/0100297 | A1 | 5/2004 | Tanioka et al. | JP | 2-129393 | 5/1990 |
| 2004/0108847 | A1 | 6/2004 | Stoll et al. | JP | 2-191352 | 7/1990 |
| 2004/0113640 | A1 | 6/2004 | Cooper et al. | JP | 3-175367 | 7/1991 |
| 2004/0124861 | A1 | 7/2004 | Zaerpoor | JP | 3-196206 | 8/1991 |
| 2004/0130787 | A1 | 7/2004 | Thome-Forster et al. | JP | 3-228348 | 10/1991 |
| 2004/0132222 | A1 | 7/2004 | Hembree et al. | JP | 4-130639 | 5/1992 |
| 2004/0134899 | A1 | 7/2004 | Hiramatsu et al. | JP | 4-159043 | 6/1992 |
| 2004/0147034 | A1 | 7/2004 | Gore et al. | JP | 4-165361 | 6/1992 |
| 2004/0162689 | A1 | 8/2004 | Jamneala et al. | JP | 4-206930 | 7/1992 |
| 2004/0175294 | A1 | 9/2004 | Ellison et al. | JP | 4-340248 | 11/1992 |
| 2004/0186382 | A1 | 9/2004 | Modell et al. | JP | 5-082631 | 4/1993 |
| 2004/0193382 | A1 | 9/2004 | Adamian et al. | JP | 5-157790 | 6/1993 |
| 2004/0197771 | A1 | 10/2004 | Powers et al. | JP | 5-166893 | 7/1993 |
| 2004/0199350 | A1 | 10/2004 | Blackham et al. | JP | 6-71425 | 3/1994 |
| 2004/0207072 | A1 | 10/2004 | Hiramatsu et al. | JP | 6-85044 | 3/1994 |
| 2004/0207424 | A1 | 10/2004 | Hollman | JP | 6-102313 | 4/1994 |
| 2004/0239338 | A1 | 12/2004 | Johnsson et al. | JP | 6-132709 | 5/1994 |
| 2004/0246004 | A1 | 12/2004 | Heuermann | JP | 7-005078 | 1/1995 |
| 2004/0251922 | A1 | 12/2004 | Martens et al. | JP | 7-12871 | 1/1995 |
| 2005/0024069 | A1 | 2/2005 | Hayden et al. | JP | 8-35987 | 2/1996 |
| 2005/0026276 | A1 | 2/2005 | Chou | JP | 8-261898 | 10/1996 |
| 2005/0030047 | A1 | 2/2005 | Adamian | JP | 8-330401 | 12/1996 |
| 2005/0054029 | A1 | 3/2005 | Tomimatsu et al. | JP | 10-116866 | 5/1998 |
| 2005/0062533 | A1 | 3/2005 | Vice | JP | 11-4001 | 1/1999 |
| 2005/0083130 | A1 | 4/2005 | Grilo | JP | 11-023975 | 1/1999 |
| 2005/0101846 | A1 | 5/2005 | Fine et al. | JP | 2000-329664 | 11/2000 |
| 2005/0156675 | A1 | 7/2005 | Rohde et al. | JP | 2001-124676 | 5/2001 |
| 2005/0164160 | A1 | 7/2005 | Gunter et al. | JP | 2001-189285 | 7/2001 |
| 2005/0165316 | A1 | 7/2005 | Lowery et al. | JP | 2001-189378 | 7/2001 |
| 2005/0168722 | A1 | 8/2005 | Forstner et al. | JP | 2002-203879 | 7/2002 |
| 2005/0174191 | A1 | 8/2005 | Brunker et al. | JP | 2002-243502 | 8/2002 |
| 2005/0178980 | A1 | 8/2005 | Skidmore et al. | SU | 843040 | 6/1981 |
| 2005/0195124 | A1 | 9/2005 | Puente Baliarda et al. | SU | 1392603 | 4/1988 |
| 2005/0236587 | A1 | 10/2005 | Kodama et al. | WO | WO98/07040 | 2/1998 |
| 2005/0237102 | A1 | 10/2005 | Tanaka | WO | WO 00/73905 | 12/2000 |
| 2006/0052075 | A1 | 3/2006 | Galivanche et al. | WO | WO 01/07207 | 2/2001 |
| 2006/0155270 | A1 | 7/2006 | Hancock et al. | WO | WO 01/69656 | 9/2001 |
| 2006/0226864 | A1 | 10/2006 | Kramer | WO | WO 2004/065944 | 8/2004 |
| 2007/0024506 | A1 | 2/2007 | Hardacker | WO | WO 2004/079299 | 9/2004 |
| 2007/0030021 | A1 | 2/2007 | Cowan et al. | WO | WO 2005/062025 | 7/2005 |

FOREIGN PATENT DOCUMENTS

| | | |
|---|---|---|
| DE | 36 37 549 | 5/1988 |
| DE | 42 23 658 | 1/1993 |
| DE | 19 522 774 | 1/1997 |
| DE | 10 000 324 | 7/2001 |
| EP | 0 230 348 | 7/1987 |
| EP | 0 259 163 | 3/1988 |
| EP | 0 304 868 | 3/1989 |
| EP | 0 945 736 | 9/1999 |
| JP | 53-037077 | 4/1978 |
| JP | 53-052354 | 5/1978 |
| JP | 55-115383 | 9/1980 |

OTHER PUBLICATIONS

Kim, Yong-Dae, et. al., "Fabrication of a Silicon Micro-Probe for Vertical Probe Card Application," Japanese Journal of Applied Physics, vol. 37, pp. 7070-7073, 1998.

Basu, Saswata, et. al., "A Membrane Quadrant Probe for R&D Applications," Cascade Microtech, Inc., three pages.

Cascade Microtech, Inc., "Information Sheet for Pyramid Probe," 5 pages, Copyright 2001.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for I/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

\* cited by examiner

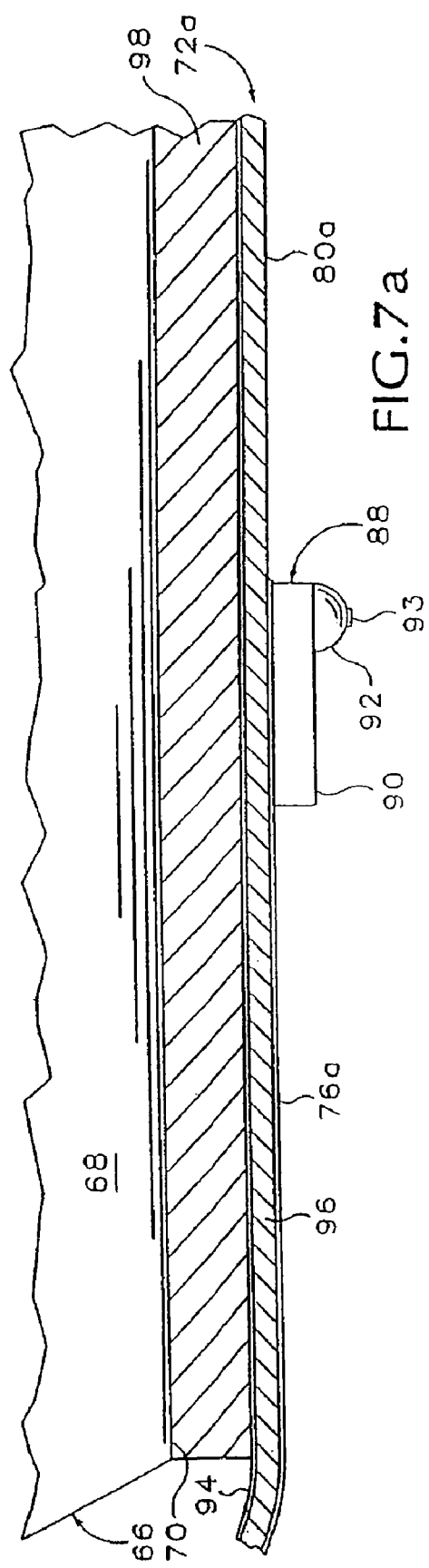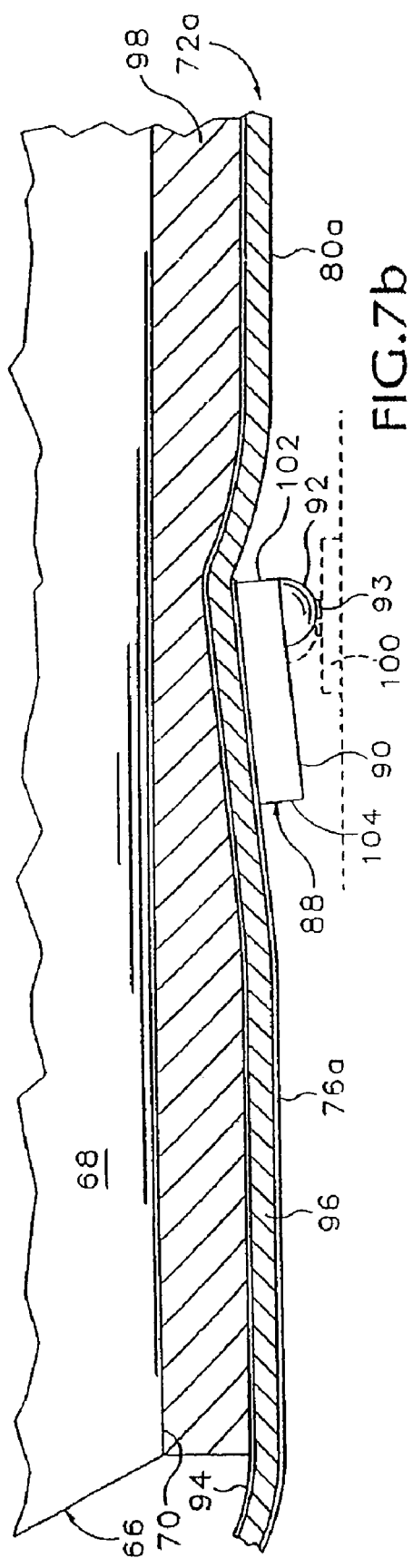

MEMBRANE PROBING STRUCTURE WITH LATERALLY SCRUBBING CONTACTS

CROSS-REFERENCE TO RELATED APPLICATIONS

This application is a continuation of U.S. patent application Ser. No. 11/897,397, filed Aug. 29, 2007, now U.S. Pat. No. 7,541,821; which is a continuation of U.S. patent application Ser. No. 11/441,673, filed May 25, 2006, now U.S. Pat. No. 7,550,983; which is a continuation of U.S. patent application Ser. No. 11/155,986, filed Jun. 17, 2005, now U.S. Pat. No. 7,109,731; which is a continuation of U.S. patent application Ser. No. 10/152,228, filed May 20, 2002, now U.S. Pat. No. 6,927,585, which is a continuation of U.S. patent application Ser. No. 09/174,384, filed Oct. 16, 1998, now U.S. Pat. No. 6,307,387, which is a continuation of U.S. patent application Ser. No. 08/695,077, filed Aug. 8, 1996, now U.S. Pat. No. 5,914,613.

BACKGROUND OF THE INVENTION

The present invention relates to probe assemblies of the type commonly used for testing the individual devices that comprise an integrated circuit (IC) and, in particular, the present invention relates to a membrane probing assembly having contacts which scrub, in a locally controlled manner, across the respective input/output conductors of each device so as to reliably wipe clear the surface oxides that are normally found on those conductors thereby ensuring good electrical connection between the probing assembly and each device.

The trend in electronic production has been toward increasingly smaller geometries particularly in integrated circuit technology wherein a very large number of discrete circuit elements are fabricated on a single substrate or "wafer." After fabrication, this wafer is divided into a number of rectangular-shaped chips or "dies" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that electrical losses are high in measurements made through these tips. Also, these tips can act in the manner of a planing tool as they wipe across their respective pads, thereby leading to excessive pad wear. This problem is magnified to the extent that the probe tips bend out of shape during use or otherwise fail to terminate in a common plane which causes the more forward ones of the tips to bear down too heavily on their respective pads Also, it is impractical to mount these tips at less than 100 micron center-to-center spacing or in a multi-row grid-like pattern so as to accommodate the pad arrangement of more modern, higher density dies.

In order to reduce inductive losses, decrease pad wear and accommodate smaller device geometries, a second type of probing assembly has been developed that uses a flexible membrane structure for supporting the probing contacts. In this assembly, lead lines of well-defined geometry are formed on one or more plies of flexible insulative film, such as polyimide or MYLAR™. If separate plies are used, these plies are bonded together to form, for example, a multilayered transmission line structure. In the central portion of this flexible structure or membrane, each conductive line is terminated by a respective probing contact which is formed on, and projects outwardly from, an outer face of the membrane. These probing contacts are arranged in a predetermined pattern that matches the pattern of the device pads and typically are formed as upraised bumps for probing the flat surfaces conventionally defined by the pads. The inner face of the membrane is supported on a supporting structure. This structure can take the form, for example, of a truncated pyramid, in which case the inner face of the center portion of the membrane is supported on the truncated end of the support while the marginal portions of the membrane are drawn away from the center portion at an angle thereto so as to clear any upright components that may surround the pads on the device.

With respect to the membrane probing assembly just described, excessive line inductance is eliminated by carefully selecting the geometry of the lead lines, and a photolithographic process is preferably used to enable precise control over the size, spacing, and arrangement, of the probing contacts so as to accommodate higher density configurations. However, although several different forms of this probing assembly have been proposed, difficulties have been encountered in connection with this type of assembly in reducing pad wear and in achieving reliable clearing of the oxide layer from each of the device pads so as to ensure adequate electrical connection between the assembly and the device-under-test.

One conventional form of membrane probing assembly, for example, is exemplified by the device shown in Rath European Patent Pub. No. 259,163A2. This device has the central portion of the sheet-like membrane mounted directly against a rigid support. This rigid support, in turn, is connected by a resilient member comprising an elastomeric or rubber block to the main body of the assembly so that the membrane can tilt to match the tilt of the device. Huff U.S. Pat. No. 4,918,383 shows a closely related device wherein radially extending leaf springs permit vertical axis movement of the rigid support while preventing it from tilting so that there is no slippage or "misalignment" of the contact bumps on the pads and further so that the entire membrane will shift slightly in the horizontal plane to allow the contacts to "scrub" across their respective pads in order to clear surface oxides from these pads.

In respect to both of these devices, however, because of manufacturing tolerances, certain of the contact bumps are likely to be in a recessed position relative to their neighbors and these recessed bumps will not have a satisfactory opportunity to engage their pads since they will be drawn away from their pads by the action of their neighbors on the rigid support. Furthermore, even when "scrub" movement is provided in the manner of Huff, the contacts will tend to frictionally cling to the device as they perform the scrubbing movement, that is, there will be a tendency for the pads of the device to move in unison with the contacts so as to negate the effect of the contact movement. Whether any scrubbing action actually occurs depends on how far the pads can move, which depends, in turn, on the degree of lateral play that exists as a result of normal tolerance between the respective bearing surfaces of the probe head and chuck. Hence this form of membrane probing assembly does not ensure reliable electrical connection between each contact and pad.

A second conventional form of membrane probing assembly is exemplified by the device shown in Barsotti European Patent Pub. No. 304,868A2. This device provides a flexible backing for the central or contact-carrying portion of the flexible membrane. In Barsotti, the membrane is directly backed by an elastomeric member and this member, in turn, is backed by a rigid support so that minor height variations between the contacts or pads can be accommodated. It is also possible to use positive-pressure air, negative-pressure air, liquid or an unbacked elastomer to provide flexible backing for the membrane, as shown in Gangroth U.S. Pat. No. 4,649,339, Ardezzone U.S. Pat. No. 4,636,772, Reed, Jr. et al. U.S. Pat. No. 3,596,228 and Okubo et al. U.S. Pat. No. 5,134,365, respectively. These alternative devices, however, do not afford sufficient pressure between the probing contacts and the device pads to reliably penetrate the oxides that form on the pad surfaces.

In this second form of membrane probing assembly, as indicated in Okubo, the contacts may be limited to movement along the Z-axis in order to prevent slippage and resulting misalignment between the contacts and pads during engagement. Thus, in Barsotti, the rigid support underlying the elastomeric member is fixed in position although it is also possible to mount the support for Z-axis movement in the manner shown in Huff U.S. Pat. No. 4,980,637. Pad damage is likely to occur with this type of design, however, because a certain amount of tilt is typically present between the contacts and the device, and those contacts angled closest to the device will ordinarily develop much higher contact pressures than those which are angled away. The same problem arises with the related assembly shown in European Patent Pub. No. 230,348A2 to Garretson, even though in the Garretson device the characteristic of the elastomeric member is such as to urge the contacts into lateral movement when those contacts are placed into pressing engagement with their pads. Yet another related assembly is shown in Evans U.S. Pat. No. 4,975,638 which uses a pivotably mounted support for backing the elastomeric member so as to accommodate tilt between the contacts and the device. However, the Evans device is subject to the friction clinging problem already described insofar as the pads of the device are likely to cling to the contacts as the support pivots and causes the contacts to shift laterally.

Yet other forms of conventional membrane probing assemblies are shown in Crumly U.S. Pat. No. 5,395,253, Barsotti et al. U.S. Pat. No. 5,059,898 and Evans et al. U.S. Pat. No. 4,975,638. In Crumly, the center portion of a stretchable membrane is resiliently biased to a fully stretched condition using a spring. When the contacts engage their respective pads, the stretched center portion retracts against the spring to a partially relaxed condition so as to draw the contacts in radial scrub directions toward the center of the membrane. In Barsotti, each row of contacts is supported by the end of a respective L-shaped arm so that when the contacts in a row engage their respective pads, the corresponding arm flexes upwardly and causes the row of contacts to laterally scrub simultaneously across their respective pads. In both Crumly and Barsotti, however, if any tilt is present between the contacts and the device at the time of engagement, this tilt will cause the contacts angled closet to the device to scrub further than those angled further away. Moreover, the shorter contacts will be forced to move in their scrub directions before they have had the opportunity to engage their respective pads due to the controlling scrub action of their neighboring contacts. A further disadvantage of the Crumly device, in particular, is that the contacts nearer to the center of the membrane will scrub less than those nearer to the periphery so that scrub effectiveness will vary with contact position.

In Evans et al. U.S. Pat. No. 5,355,079 each contact constitutes a spring metal finger, and each finger is mounted so as to extend in a cantilevered manner away from the underlying membrane at a predetermined angle relative to the membrane. A similar configuration is shown in Higgins U.S. Pat. No. 5,521,518. It is difficult, however, to originally position these fingers so that they all terminate in a common plane, particularly if a high density pattern is required. Moreover, these fingers are easily bent out of position during use and cannot easily be rebent back to their original position. Hence, certain ones of the fingers are likely to touch down before other ones of the fingers, and scrub pressures and distances are likely to be different for different fingers. Nor, in Evans at least, is there an adequate mechanism for tolerating a minor degree of tilt between the fingers and pads. Although Evans suggests roughening the surface of each finger to improve the quality of electrical connection, this roughening can cause undue abrasion and damage to the pad surfaces. Yet a further disadvantage of the contact fingers shown in both Evans and Higgins is that such fingers are subject to fatigue and failure after a relatively low number of "touchdowns" or duty cycles due to repeated bending and stressing.

In accordance with the foregoing, an object of at least preferred embodiments of the present invention is to provide a probing assembly which can reliably make electrical connection with a high density arrangement of pads on an electrical device despite the buildup of oxides or other contaminants on the pad surfaces.

Another object of at least preferred embodiments of the present invention is to provide a membrane probing assembly that ensures adequate scrubbing action between each contact and pad despite minor variations in contact height.

Another object of at least preferred embodiments of the present invention is to provide a probing assembly that can reliably operate over a large number of duty cycles without failure.

Another object of at least preferred embodiments of the present invention is to provide a membrane probing assembly providing uniformly effective scrubbing action in respect to the contacts independent of the respective positions of the contacts.

BRIEF SUMMARY OF THE INVENTION

A probing assembly system for probing an electrical device in accordance with the present invention provides a forward support of incompressible material, a flexible membrane assembly mounted with its central region overlying the support, a plurality of rigid contacts disposed on the membrane assembly within the central region each including a beam and a contacting portion, each contacting portion being arranged in suitable position for pressing engagement with a corresponding pad on the device, each beam being electrically connected to a corresponding flexible conductor that extends into the central region. In accordance with the present invention, the probing assembly further provides a pressure control mechanism including an elastomeric member interposed between each contact and the support and a motion control mechanism locally operating in respect to each contact to urge each beam, when the corresponding contacting portion is placed into pressing engagement with the respective pad, into tilting motion so that different portions of each beam move different distances relative to the forward support and so that each contact is driven, in accordance with this tilting motion, into a lateral scrubbing movement across the corresponding pad. The elastomeric member is positioned so as to resiliently oppose the tilting motion and so as to enable each contact to recover from this tilting motion in a manner avoiding mechanical straining of each beam.

In accordance with the foregoing system, a high-density arrangement of contacts can be provided on the probing assembly using, for example, a photolithographic process to define both the contacts and their lead-in conductors on the flexible membrane assembly. The resiliency of the elastomeric member accommodates minor height variations that may exist between adjacent ones of the contacts, and the incompressible support that backs the elastomeric member ensures that this member will sufficiently bear against the contacts to maintain an adequate level of contact-to-pad pressure during scrubbing. The elastomeric member further serves as a reliable mechanism for enabling the beam of each rigid contact to recover after tilting thereby avoiding the need to rely on the type of elastic recovery provided by mechanically strained contact needles or fingers, which alternative system can lead to ineffective electrical performance as the contact needles or fingers bend out of shape during use or prematurely fail due to bending fatigue. Further in accordance with the present invention, by urging each contact into tilting motion by means of a locally operating motion control mechanism so that different portions of each beam move different distances relative to the support and so that each contact is thereby driven into lateral wiping movement across the corresponding pad, scrubbing action between the contacts and pads is achieved in a manner effective for clearing oxides from the pads. It is possible, in particular, to achieve a high level of scrub effectiveness in relation to each contact on the assembly in accordance with this type of localized tilt control.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIGS. 7a-7b are sectional views taken along lines 7a-7a in FIG. 6 first showing an exemplary contact before touchdown and then showing the same contact after touchdown and scrub movement across its respective pad.

FIG. 11f shows the final construction.

DETAILED DESCRIPTION OF PREFERRED EMBODIMENT

Figure 1:
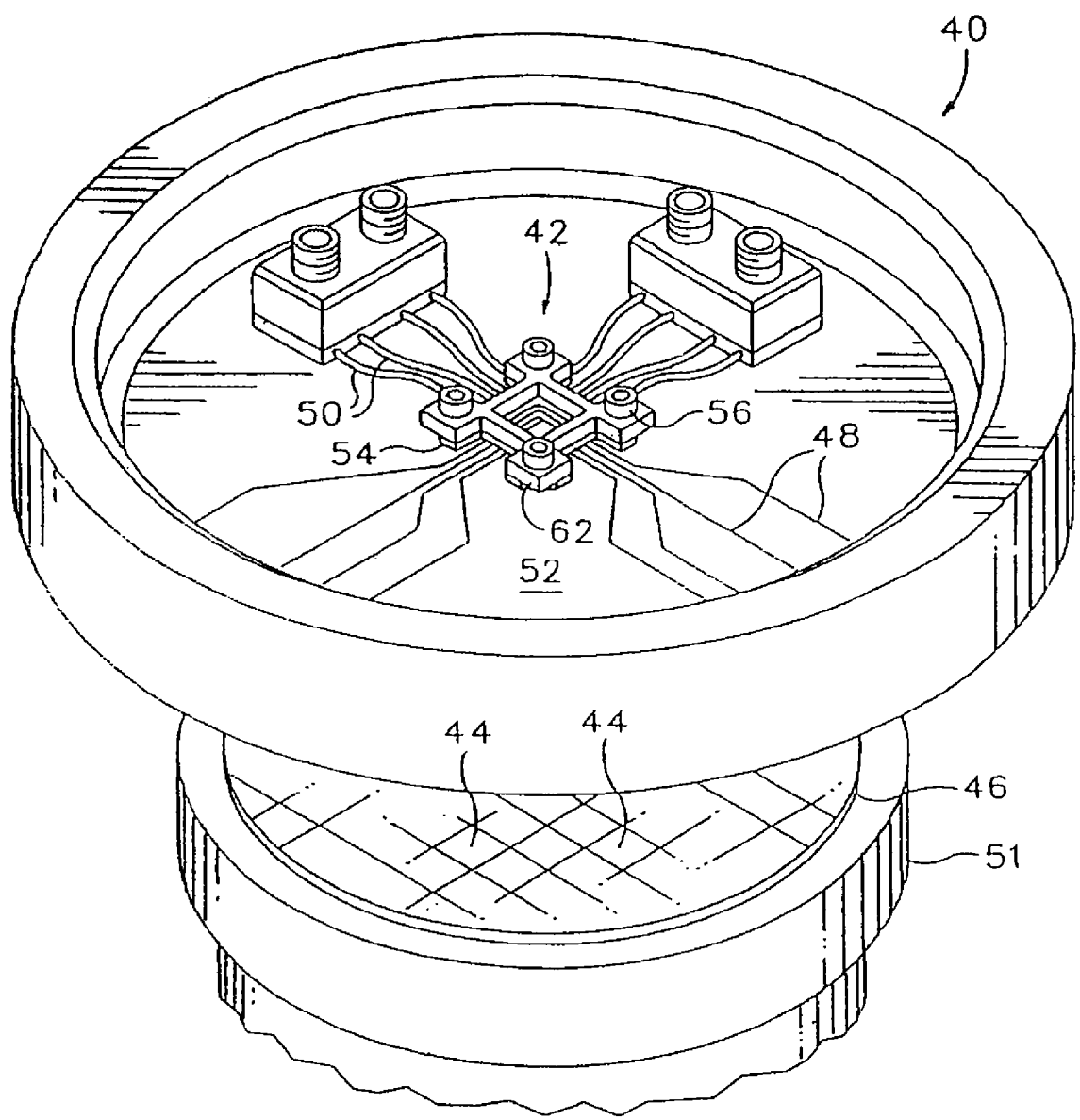
FIG. 1 is a perspective view showing an exemplary membrane probing assembly bolted to a probe head and a wafer supported on a chuck in suitable position for probing by this assembly.

FIG. 1 shows a probe head 40 for mounting a membrane probing assembly 42 constructed in accordance with the present invention. In order to measure the electrical performance of a particular die area 44 included on the silicon wafer 46, the high-speed digital lines 48 and/or shielded transmission lines 50 of the probe head are connected to the input/output ports of the test instrumentation by a suitable cable assembly, and the chuck 51 which supports the wafer is moved in mutually perpendicular X,Y,Z directions in order to bring the pads of the die area into pressing engagement with the contacts included on the lower contacting portion of the membrane probing assembly.

Figure 2:
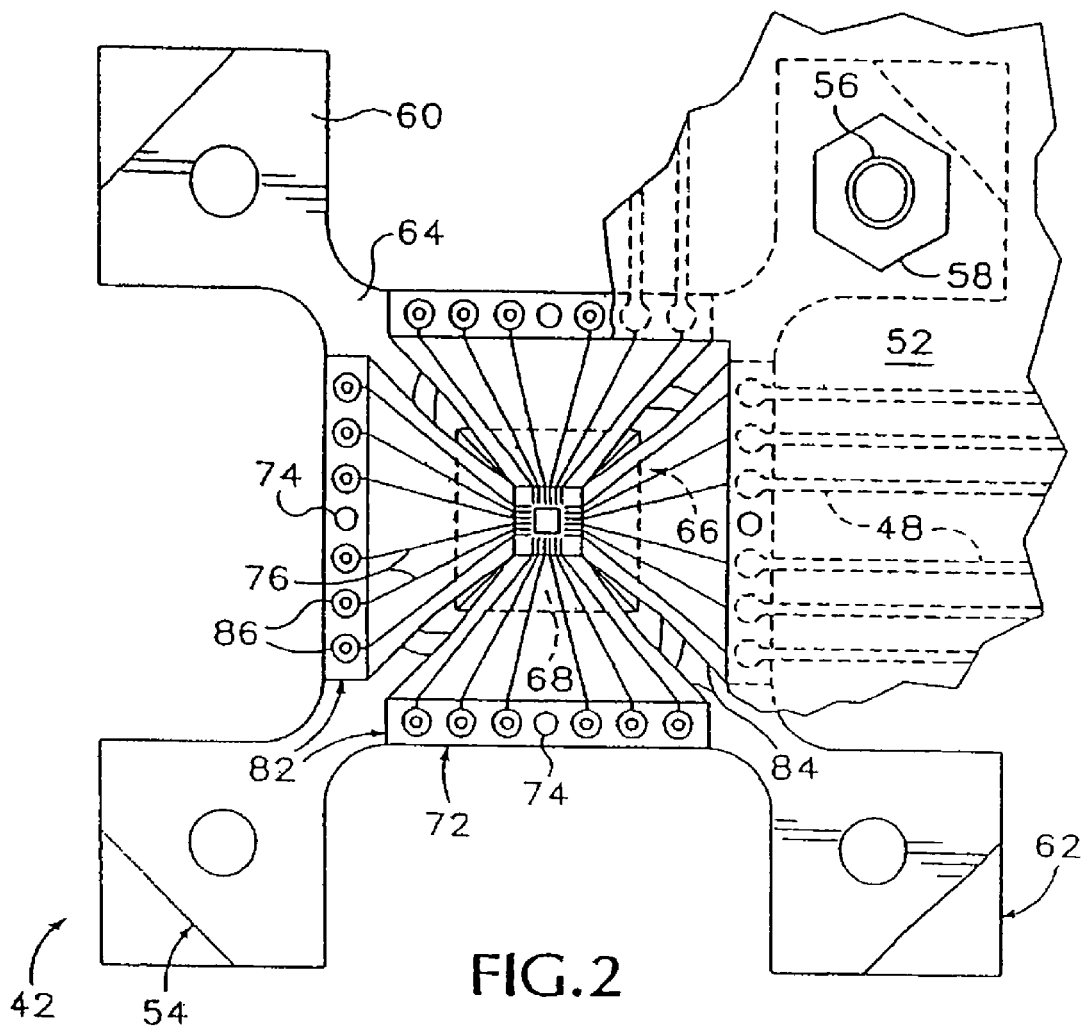
FIG. 2 is a bottom elevational view showing various parts of the probing assembly of FIG. 1, including a support element and flexible membrane assembly, and a fragmentary view of a probe card having data/signal lines connected with corresponding lines on the membrane assembly.
Figure 3:
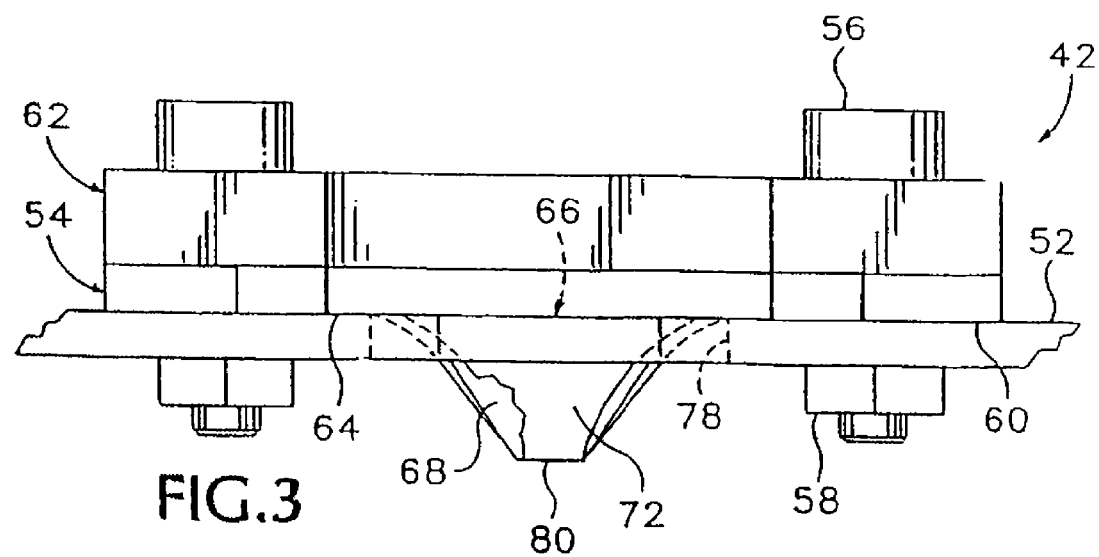
FIG. 3 is a side elevational view of the membrane probing assembly of FIG. 1 where a portion of the membrane assembly has been cut away to expose hidden portions of the support element.

The probe head 40 includes a probe card 52 on which the data/signal lines 48 and 50 are arranged. Referring to FIGS. 2-3, the membrane probing assembly 42 includes a support element 54 formed of incompressible material such as a hard polymer. This element is detachably connected to the upper side of the probe card by means of four Allen screws 56 and corresponding nuts 58 (each screw passes through a respective attachment arm 60 of the support element, and a separate backing element 62 evenly distributes the clamping pressure of the screws over the entire back side of the supporting element). In accordance with this detachable connection, different probing assemblies having different contact arrangements can be quickly substituted for each other as needed for probing different devices.

Figure 4:
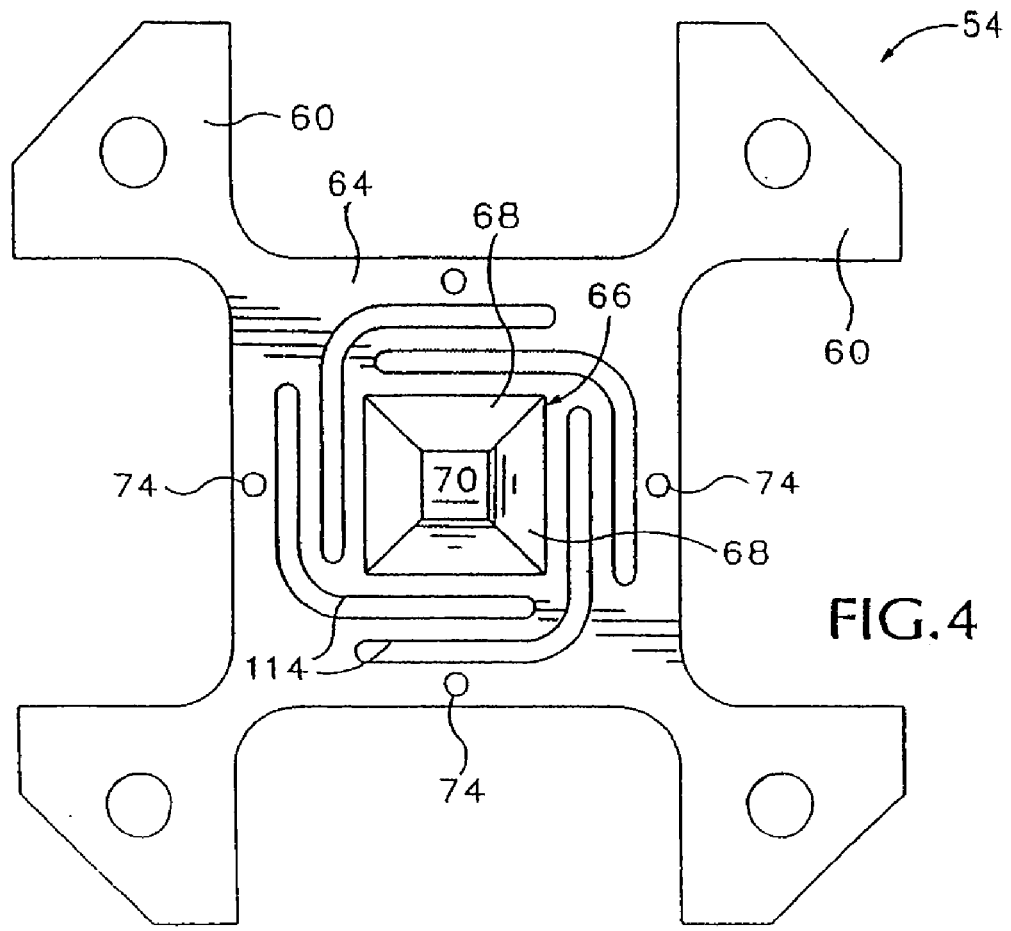
FIG. 4 is a top elevational view of an exemplary support element.

Referring to FIGS. 3-4, the support element 54 includes a rearward base portion 64 to which the attachment arms 60 are integrally joined. Also included on the support element 54 is a forward support or plunger 66 that projects outwardly from the flat base portion. This forward support has angled sides 68 that converge toward a flat support surface 70 so as to give the forward support the shape of a truncated pyramid. Referring also to FIG. 2, a flexible membrane assembly 72 is attached to the support after being aligned by means of alignment pins 74 included on the base portion. This flexible membrane assembly is formed by one or more plies of insulative sheeting such as KAPTON™ sold by E.I. Du Pont de Nemours or other polyimide film, and flexible conductive layers or strips are provided between or on these plies to form the data/signal lines 76.

When the support element 54 is mounted on the upper side of the probe card 52 as shown in FIG. 3, the forward support 66 protrudes through a central opening 78 in the probe card so as to present the contacts which are arranged on a central region 80 of the flexible membrane assembly in suitable position for pressing engagement with the pads of the device under test. Referring to FIG. 2, the membrane assembly includes radially extending arm segments 82 that are separated by inwardly curving edges 84 that give the assembly the shape of a formee cross, and these segments extend in an inclined manner along the angled sides 68 thereby clearing any upright components surrounding the pads. A series of contact pads 86 terminate the data/signal lines 76 so that when the support element is mounted, these pads electrically engage corresponding termination pads provided on the upper side of the probe card so that the data/signal lines 48 and 50 on the probe card are electrically connected to the contacts on the central region.

An important feature of the exemplary membrane probing assembly 42 is its capability for probing a high-density arrangement of contact pads over a large number of contact cycles in a manner that ensures reliable electrical connection between the contacts and pads in each cycle despite oxide buildup on the pads. This capability is a function of the construction of the support element 54, the flexible membrane assembly 72 and their manner of interconnection. In particular, the membrane assembly is so constructed and connected to the support element that the contacts on the membrane assembly preferably wipe or scrub, in a locally controlled manner, laterally across the pads when brought into pressing engagement with these pads. The preferred mechanism for producing this scrubbing action will now be described in connection with the construction and interconnection of a preferred membrane assembly 72a as best depicted in FIGS. 6 and 7a-7b.

Figure 6:
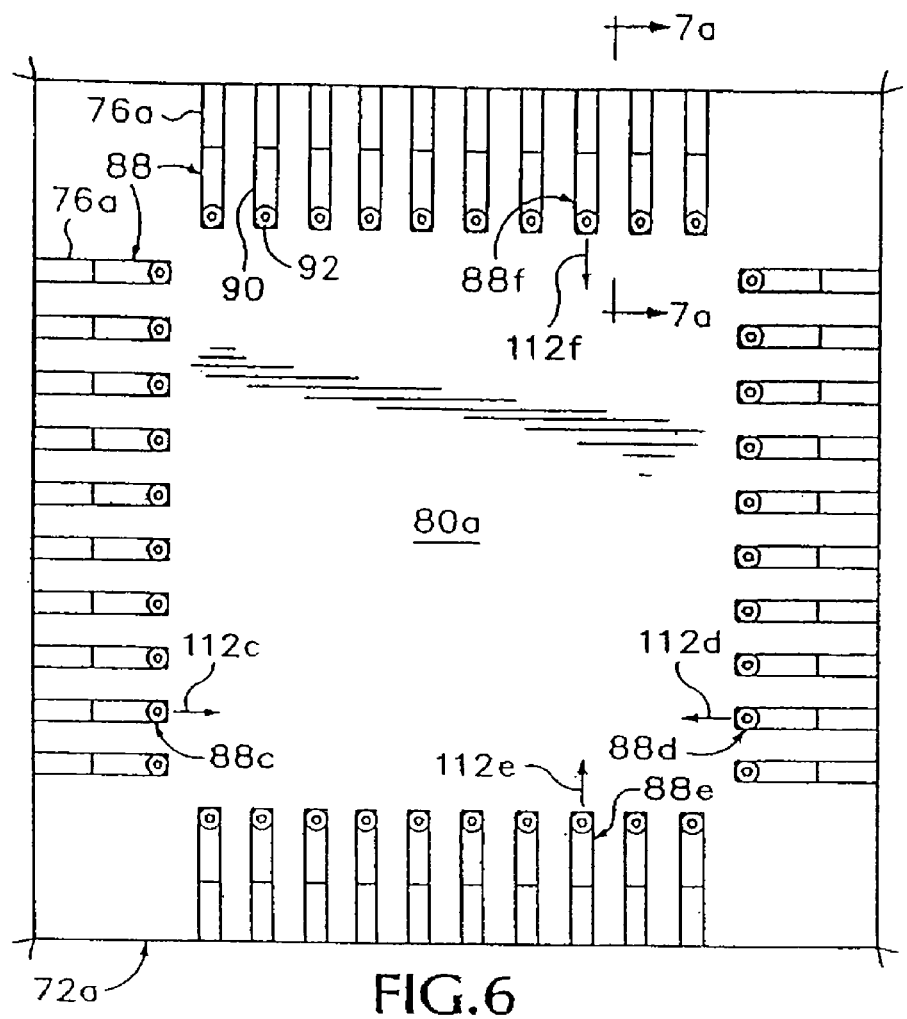
FIG. 6 is an enlarged top elevational view of the central region of an exemplary construction of the membrane assembly of FIG. 2.

FIG. 6 shows an enlarged view of the central region 80a of the preferred membrane assembly 72a. In this embodiment, the contacts 88 are arranged in a square-like pattern suitable for engagement with a square-like arrangement of pads. Referring also to FIG. 7a, which represents a sectional view taken along lines 7a-7a in FIG. 6, each contact comprises a relatively thick rigid beam 90, preferably 150 to 250 microns long, at one end of which is formed a rigid contact bump 92. The contact bump includes thereon a contacting portion 93, which, in the embodiment illustrated, comprises a nub of rhodium nickel alloy fused to the contact bump, although the contacting portion may, alternatively, comprise the rounded sides of the contact bump itself. Using a conventional process, such as electroplating, each beam is preferably formed in an overlapping connection with the end of a flexible conductive trace 76a to form a large surface joint therewith. This conductive trace in conjunction with a backplane conductive layer 94 effectively provides a controlled impedance data/signal line to the contact and hence its dimensions are preferably established precisely using a photolithographic process. The backplane layer preferably includes openings therein to assist, for example, with gas venting during fabrication.

For ease of illustration, the flexible membrane assembly 72a is shown as having only a single dielectric ply 96, preferably polyimide; however, multiple dielectric plies and conductive layers will normally be used in accordance with conventional layering techniques. The membrane assembly is interconnected to the flat support surface 70 by an interposed elastomeric layer 98, which layer is coextensive with the support surface and can be formed by a silicon rubber compound such as ELMER'S STICK-ALL™ made by the Borden Company or Sylgard 182 by Dow Corning Corporation. This compound can be conveniently applied in a paste-like phase which hardens as it sets. The flat support surface, as previously mentioned, is made of incompressible material and is preferably a hard dielectric such as polysulfone or glass.

In accordance with the above-described construction, when one of the contacts 88 is brought into pressing engagement with a respective pad 100, as indicated in FIG. 7b, the resulting off-center force on the rigid beam 90 and bump 92 structure causes the beam to pivot or tilt against the elastic recovery force provided by the elastomeric pad 98. This tilting motion is localized in the sense that a forward portion 102 of the beam moves a greater distance toward the flat support surface 70 than a rearward portion 104 of the same beam. The effect is such as to drive the contact into lateral scrubbing movement across the pad as is indicated in FIG. 7b with a dashed-line and solid-line representation showing the beginning and ending positions, respectively, of the contact on the pad. In this fashion, the insulative oxide buildup on each pad is removed so as to ensure reliable contact-to-pad electrical connections.

Figure 8:
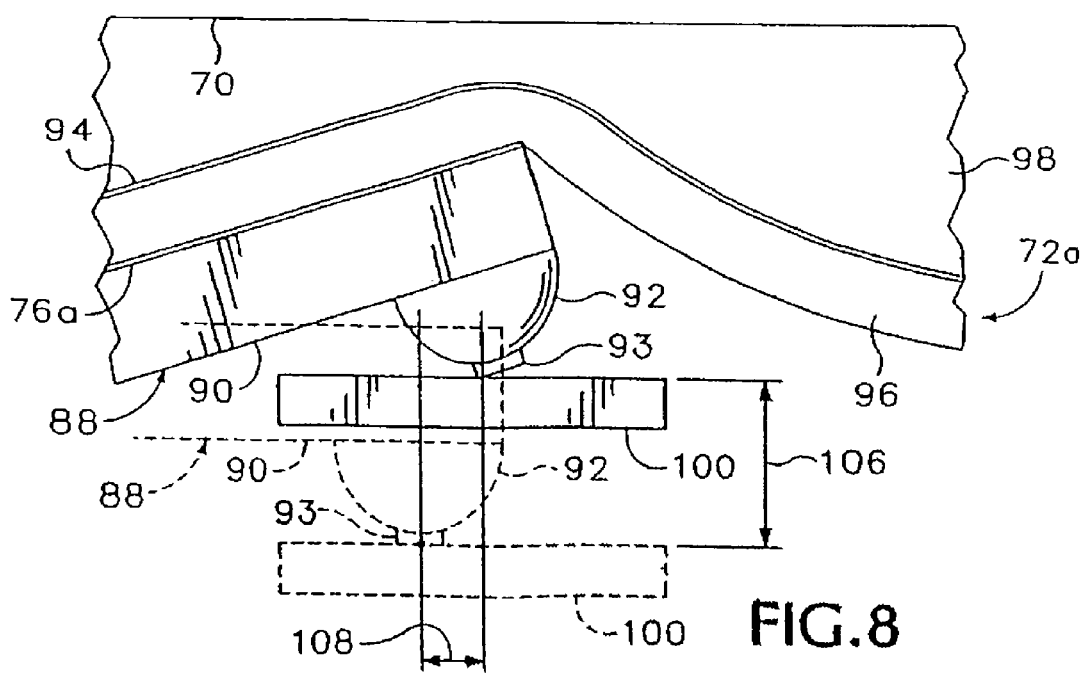
FIG. 8 is a schematic side view showing, in dashed-line representation, the exemplary contact of FIGS. 7a-7b at the moment of initial touchdown and, in solid-line representation, the same contact after further vertical overtravel by the pad.

FIG. 8 shows, in dashed line view, the relative positions of the contact 88 and pad 100 at the moment of initial engagement or touchdown and, in solid-line view, these same elements after "overtravel" of the pad by a distance 106 in a vertical direction directly toward the flat support surface 70. As indicated, the distance 106 of lateral scrubbing movement is directly dependent on the vertical deflection of the contact 88 or, equivalently, on the overtravel distance 108 moved by the pad 100. Hence, since the overtravel distance for each contact on the central region 80a will be substantially the same (with differences only arising from minor variations in contact height), the distance of lateral scrubbing movement by each contact on the central region will be substantially uniform and will not, in particular, be affected by the relative position of each contact on the central region.

Figure 9A:
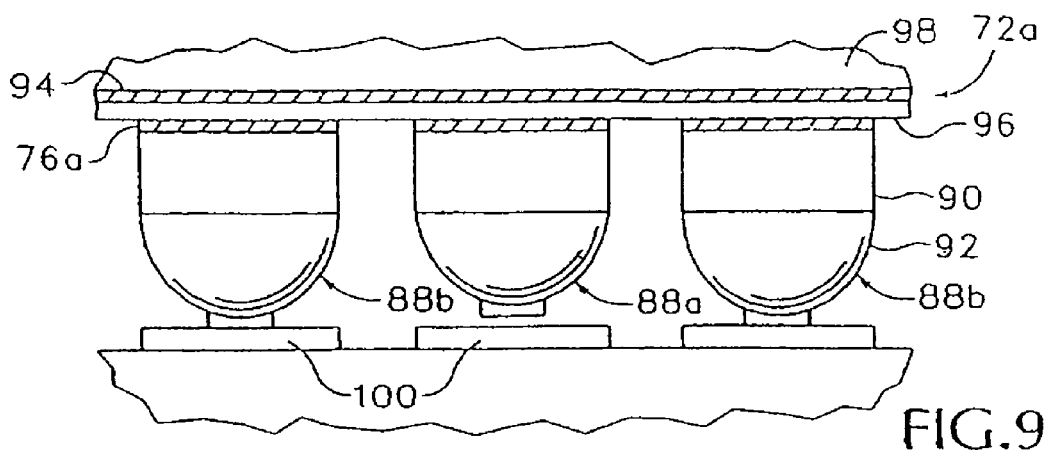
FIGS. 9a-9b are schematic side views showing three of the exemplary contacts of FIG. 6 and how such contacts engage their respective pads despite minor height variations between the contacts.
Figure 9B:
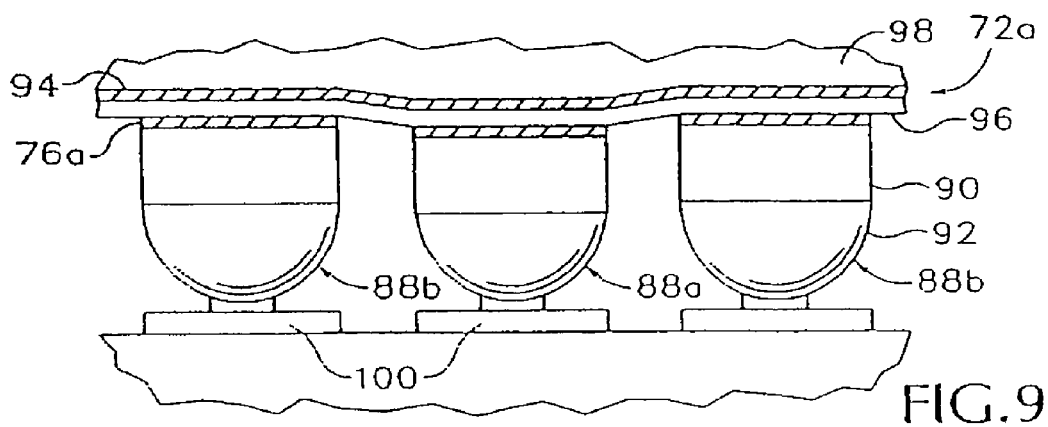

Because the elastomeric layer 98 is backed by the incompressible support surface 70, the elastomeric layer exerts a sufficient recovery force on each tilting beam 90 and thus each contact 88 to maintain an adequate level of contact-to-pad pressure during scrubbing. At the same time, the elastomeric layer accommodates minor height variations between the respective contacts. Thus, referring to FIG. 9a, when a relatively shorter contact 88a is situated between an immediately adjacent pair of relatively taller contacts 88b and these taller contacts are brought into engagement with their respective pads, then, as indicated in FIG. 9b, deformation by the elastomeric layer allows the smaller contact to be brought into engagement with its pad after only a small amount of further overtravel by the pads. It will be noted, in this example, that the tilting action of each contact is locally controlled, and the larger contacts are able, in particular, to tilt independently of the smaller contact so that the smaller contact is not urged into lateral movement until it has actually touched down on its pad.

In respect to the preferred membrane assembly 72a, not only is the distance and pressure of the scrub action of each contact 88 well regulated, but so also is the scrub direction. In FIG. 6 the respective scrub directions of contacts 88c-f are indicated by means of directional arrows 112c-f. As shown, each contact scrubs forwardly in the direction of the longitudinal axis of its beam 90. Preferably, as further shown, the contacts are arranged in pairs (88c, 88d or 88e, 88f) in which the respective contacts of each pair scrub in opposite directions. Accordingly, in relation to the wafer or device on which the pads are formed, the scrubbing force exerted on the device by the first contact of each pair is cancelled out by the scrubbing force exerted by the second contact of each pair. Hence, the device is not dragged frictionally along by these scrubbing forces in a manner that can reduce or even prevent desirable scrubbing action between the contacts and pads In addition to providing reliable electrical connection with the device under test, the preferred membrane assembly 72a is able to provide such connection over a large number of contact or touchdown cycles. The elastomeric layer 98, in particular, serves as a reliable mechanism for enabling each beam 90 to recover from each touchdown operation, thereby avoiding the need to rely on a failure prone recovery mechanism such as bending and mechanical straining of any portion of the stiff contacts themselves. To prevent excessive wearing of the contacts 88, as mentioned above, each contact includes a contacting portion or nub 93 of rhodium nickel alloy, and the beam 90 and contact bump 92 are also formed of nickel alloy. The flexible traces 76a are preferably of highly conductive metal, such as gold, for good connection with the contacts.

Figure 5A:
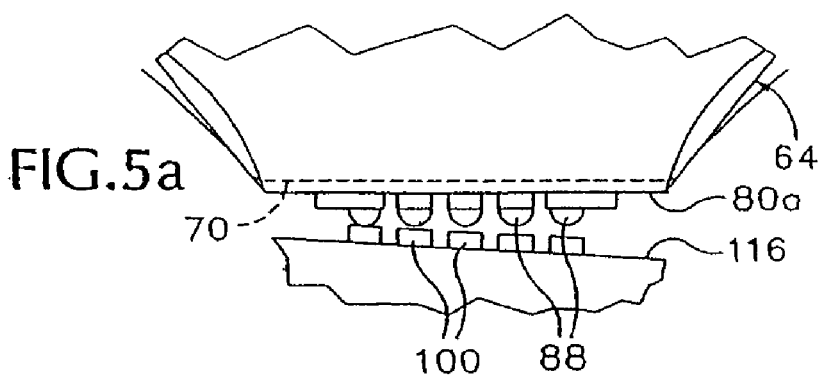
FIGS. 5a-5b are schematic side elevational views illustrating how the exemplary support element and membrane assembly are capable of tilting to match the orientation of the device under test.
Figure 5B:
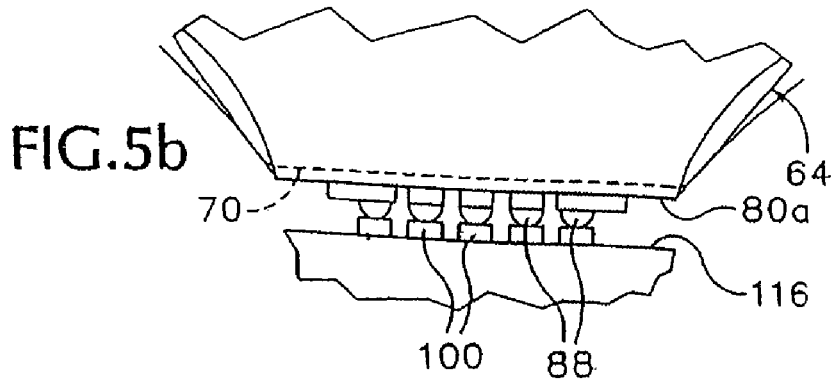

Referring to FIG. 4, L-shaped slots 114 are formed in the rearward base portion 64 to permit the forward support 66 to tilt relative to the base portion. Accordingly, if the flat support surface 70 and the device under test 116 are in tilted relationship to each other prior to touchdown, as shown in FIG. 5a, when touchdown occurs, the engagement pressure between the contacts 88 and pads 100 will automatically move the support surface to a position parallel with the device, as shown in FIG. 5b. This prevents those ones of the contacts that are initially angled closest to the device from bearing down too heavily on their pads which can result in damage to the pad surfaces. Also, this normalizes the distance between the support surface and each pad once full engagement is reached. Since this pad-to-surface distance determines the amount of deflection of each contact and since this deflection determines the scrub pressure and distance for each contact as herein-above described, the respective scrub pressures and distances of the contacts are therefor normalized in respect to each other despite any ordinary amount of initial tilt that may exist between the support surface and device.

Figure 10A:
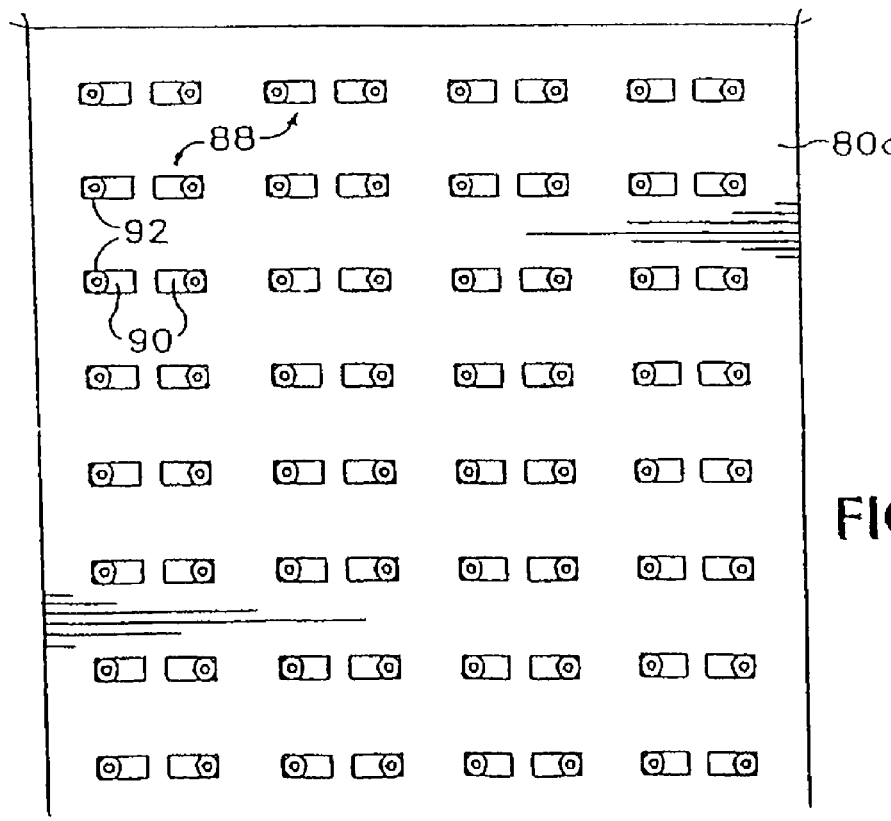
FIGS. 10a-10b are top views comparable to FIG. 6 but showing alternative contact patterns.
Figure 10B:
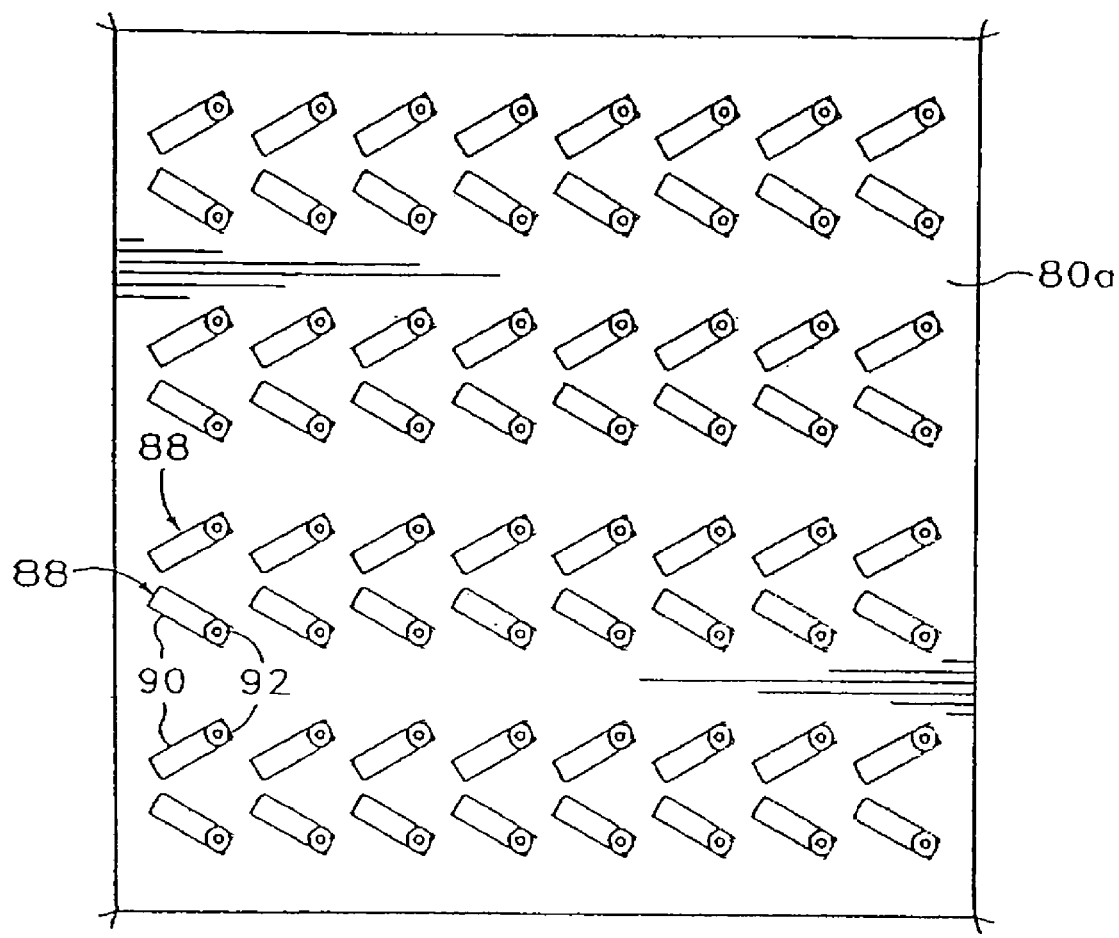
Figure 10C:
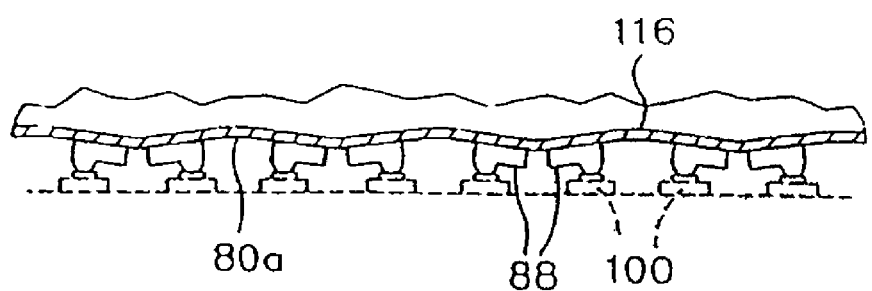
FIG. 10c is a side elevational view showing the appearance of the contacts in each of these patterns after touchdown and scrub across their respective contacts.

In addition to providing reliable electrical connections over a large number of contact cycles, the exemplary membrane probing assembly 42 can also be configured to accommodate the high density arrangement of contact pads of the type found on more modern devices. Referring, for example, to FIG. 10a, the contacts 88 can be arranged so as to be aligned with each other in rows and columns. The contact bumps 92 thus conform to a 2-dimensional grid pattern corresponding to the pad pattern of higher density devices. A 2-dimensional grid pattern can also be achieved by arranging the contacts in chevron-shaped pairs as shown in FIG. 10b. In this arrangement, the length of each beam 90 is preferably longer than or nearly as long as half the spacing between the contact bumps so that only a one-dimensional deformation of the polyimide ply layers 116 is required as schematically represented in FIG. 10c (the deformation of the polyimide ply layers for the row and column arrangement of contacts would look the same from the view shown) In these higher density embodiments, the conductive traces that form the data/signal lines to the contacts pass between the polyimide layers, and each trace is connected to the corresponding contact by a conductive through via (not shown).

An exemplary flexible membrane assembly 72a and its interconnection to the flat support surface 70 by an elastomeric layer 98 has now been described. This construction provides an exemplary embodiment for the contacting portion of the membrane probing assembly 42. However, it will be recognized that alternative embodiments of the contacting portion are also possible without departing from the broader principles of the present invention.

Figure 13:
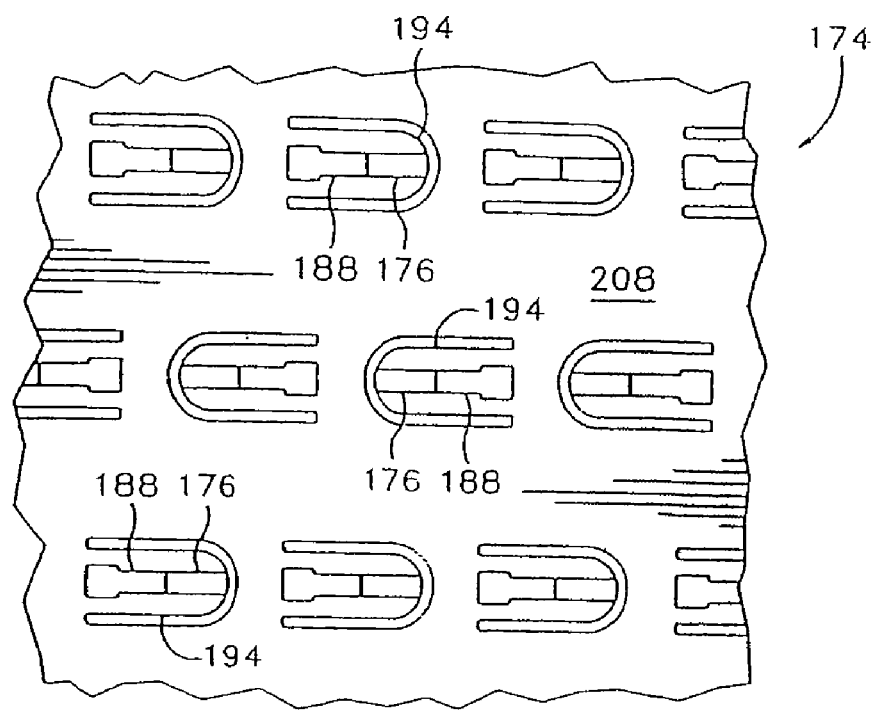
FIG. 13 is a top elevational view of the alternative embodiment shown in FIG. 11f.

FIGS. 11a-11e show a sequence of steps used in the construction of an alternative embodiment 174 of the center portion of the membrane assembly. The finished construction is shown in FIGS. 11f and 13.

Figure 11A:
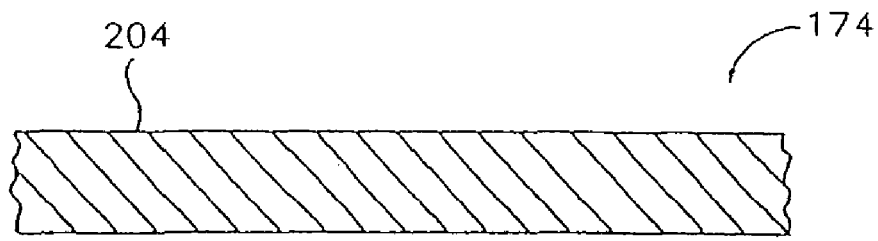
FIGS. 11a-11f are sectional side views of an alternative embodiment of the center portion of the membrane probing assembly in successive stages of manufacture.
Figure 11B:
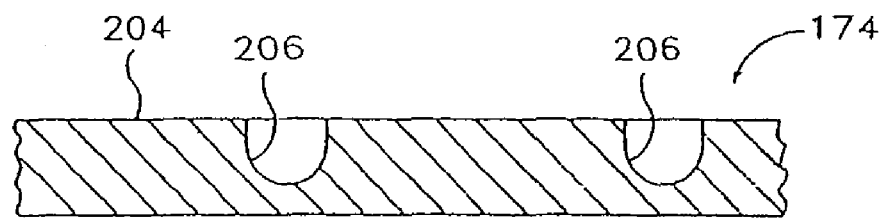
Figure 11C:
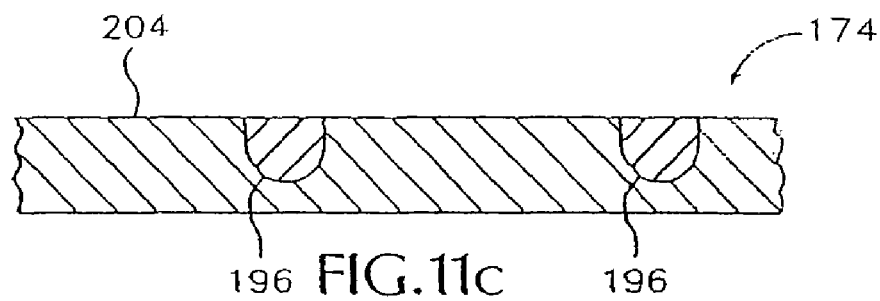
Figure 11D:
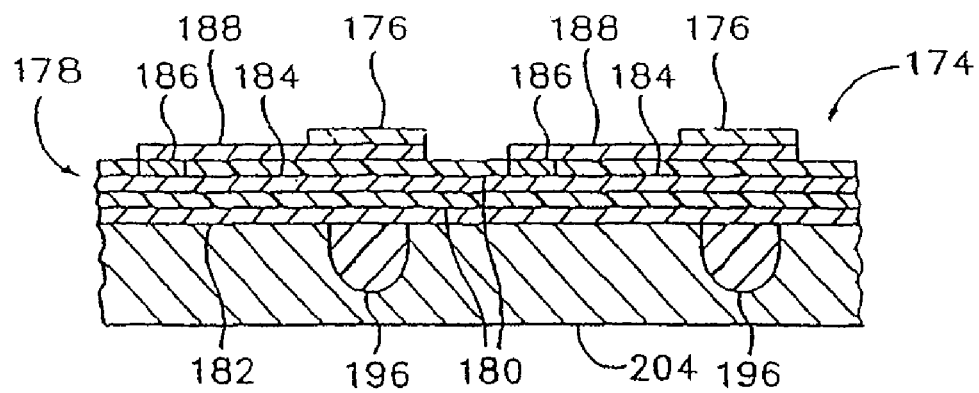
Figure 11E:
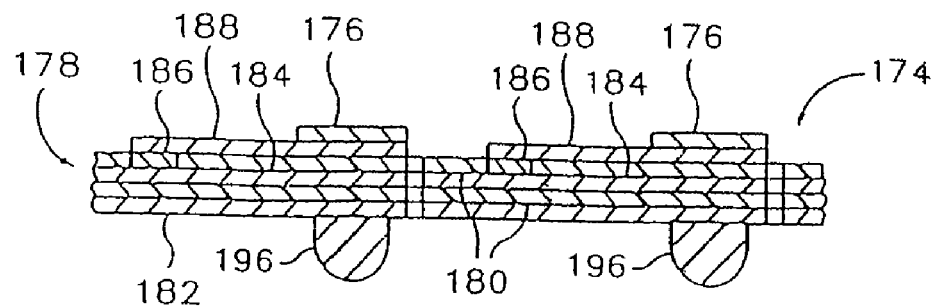
Figure 11F:
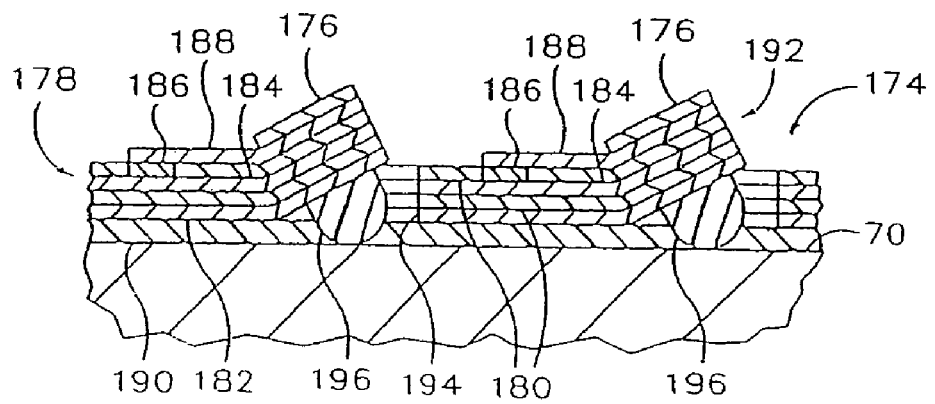

Referring to FIG. 11f, in this alternative embodiment, rigid contact beams 176, such as of rhodium nickel alloy, are provided on the outer face of the flexible membrane assembly 178. To accommodate a high density contact pattern (FIG. 13), the membrane assembly is formed by multiple polyimide layers 180 (only two layers are shown for ease of illustration) and includes a conductive backplane 182 and flexible strip-like lines 184 that pass through the layers. Each line connects to a respective contact beam by a through via 186 and a short conductive trace 188 (preferably of highly conductive metal such as gold for good electrical contact with the nickel alloy beam) to provide the required data/signal line.

A bonding compound 190 attaches the membrane assembly to the flat support surface 70 except for U-shaped flap portions 192 of the assembly. These flap portions each support a respective one of the contact beams and are formed by U-shaped slits 194 (FIG. 13) cut through the assembly. An elastomeric hub 196 is attached beneath each flap portion. This hub maintains the corresponding contact beam in an inclined position relative to the support surface and enables the beam to tilt in a localized manner in relation to the surface.

Figure 12:
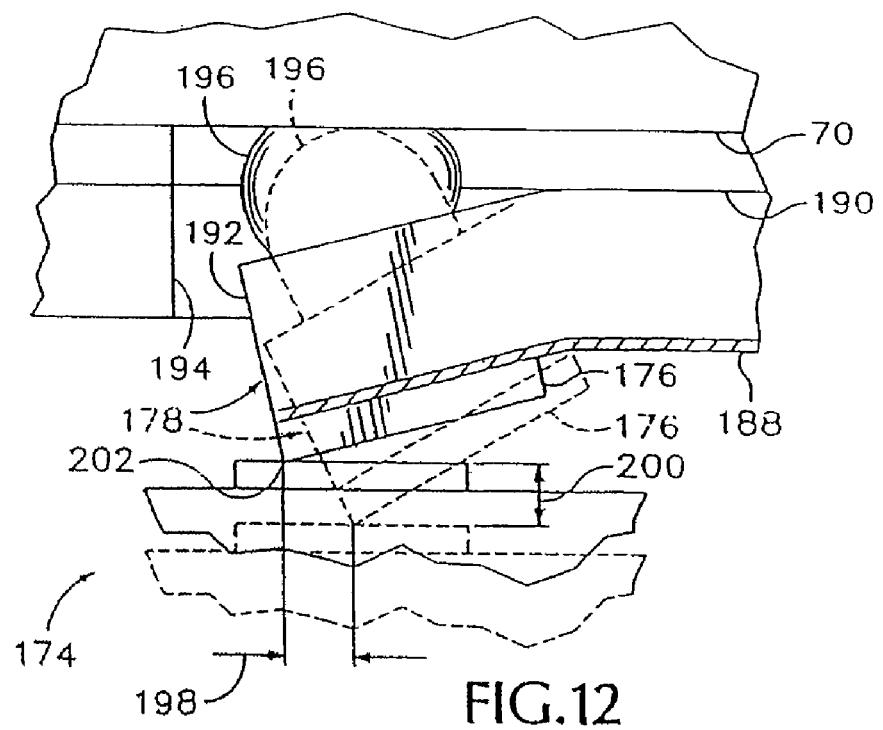
FIG. 12 is a schematic side view showing, in dashed-line representation, a contact of the alternative embodiment of FIG. 11f at the moment of initial touchdown and, in solid-line representation, the same contact after further vertical overtravel by the pad.

Referring to FIG. 12, when each contact beam 176 touches down on its respective pad 100, the U-shaped flap portion 192 is deflected toward the flat support surface 70 against the resilient bias provided by the elastomeric hub 196. This causes the contact beam to tilt relative to the support surface in such a manner that different portions (forward and rearward) of this beam-shaped contact move different distances relative to the surface and the contact beam is driven into lateral scrubbing movement across the pad The distance 198 of this lateral scrubbing movement directly depends on the distance of vertical deflection of the contact beam or, equivalently, on the distance of overtravel 200 of the pad beyond the position of initial touchdown. Aside from minor variations in contact height, this distance will be substantially the same for each beam-shaped contact thereby resulting in uniform scrub movements by the different contacts.

Although they are not as convenient to manufacture as the unitary elastomeric layer 98 (refer to FIG. 8), the elastomeric hubs 196 collectively provide the same primary functions as this layer. That is, each elastomeric hub, acting in conjunction with the incompressible support surface 70, ensures that the corresponding contact beam 176 will bear down with sufficient pressure as it scrubs across its pad and, once engagement is complete, ensures that the contact beam will recover from its tilting motion in a manner that avoids bending or mechanical straining of the beam. This approach is preferable over that of providing a contact beam or finger where a portion of the beam is bent in a cantilevered manner away from the underlying support. Under this latter approach, the inherent resiliency of the metal contained in the beam is relied on to provide the recovery mechanism, and the beam is therefor subject to strain fatigue and premature failure.

Referring to FIGS. 11a and 11b, in constructing the alternative contacting portion 174, first a sacrificial substrate 204 is provided and openings 206 are formed in the substrate, nominally of 3 mil depth, in the desired locations for the elastomeric hubs 196. The openings are then filled with silicon rubber to form the hubs 196, as shown in FIG. 11c, and the preassembled flexible membrane assembly 178 is bonded to the substrate and hubs, as shown in FIG. 11d. Next the sacrificial substrate is dissolved or etched away leaving the hubs attached to the membrane assembly, and the U-shaped slits 194 are cut through the assembly as shown in FIG. 11e. Finally, the bonding compound 190 is applied to the backside of the membrane assembly so as to run about halfway into each U-shaped slit, and the entire assembly is pressed down against the support surface 70 in such a manner that each beam-shaped contact 176 is turned outwardly by means of rolling action about the corresponding hub to an inclined position as shown in FIG. 11f. The finished construction is shown in side sectional view in FIG. 11f and in top view in FIG. 13.

Figure 14:
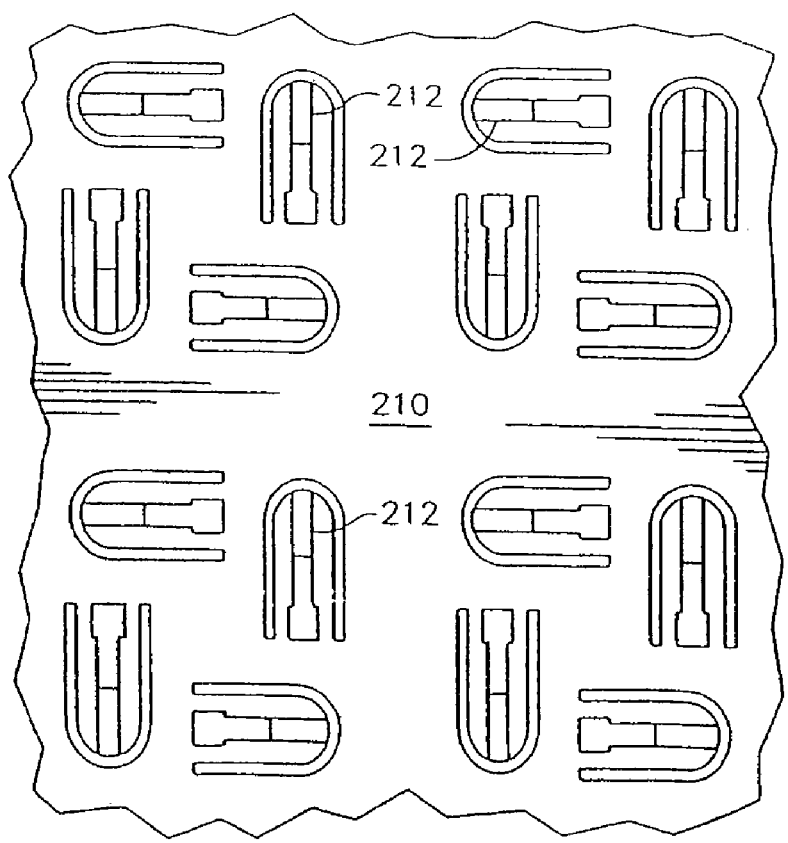
FIG. 14 is a top elevational view of a modified form of the alternative embodiment shown in FIG. 11f.

In the contact pattern shown in FIG. 13, the contact beams 176 are arranged in parallel rows of opposite direction on the central region 208 of the flexible membrane assembly Alternative contact patterns are also possible as shown in FIG. 14 where, on the central region 210, the contact beams 212 are arranged in clusters of four where each contact in a particular cluster extends in one of the four compass directions (north, south, east, or west). It will be noted that in neither pattern do all the contacts scrub in the same direction in a manner likely to cause the pads of the device to be dragged frictionally along by the contacts. Hence the contact patterns shown help to ensure that effective scrubbing action occurs between the contact beams and pads.

An exemplary construction for a membrane probing assembly 42 as well as an alternative construction for the center portion of the assembly and a variation thereof have now been shown and described. However, it will be recognized that other constructions are possible without departing from the broader principles of the present invention.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow. The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A structure suitable for use with a probe for probing an electrical device, said structure comprising:
   (a) an elastic membrane; and
   (b) a plurality of rigid contacts each supported by an elongate portion of a first surface of said elastic membrane and having a contacting portion located nearer a first end of said elongate portion than a second end of said elongate portion, displacement of said respective elongate portion relative to a second surface of said elastic membrane when said respective contacting portion is pressed into engagement with said electrical device causing said respective contact to tilt and said contacting portion to scrub laterally across said electrical device.

2. The structure of claim 1 wherein each of said contacting portions is spaced apart from an axis of moment of said respective contact.

3. The structure of claim 1 wherein said elastic membrane is in an overlying relationship to a support.

4. The structure of claim 3 wherein said support is made of incompressible material.

5. The structure of claim 3 wherein said support is rigid material.

6. The structure of claim 3 wherein said elastic membrane has a central region positioned in said overlying relationship to said support.

7. The structure of claim 3 wherein the distance of said lateral scrubbing movement of each contact after touchdown of each contacting portion is dependent for each contact on the distance traveled after touchdown in reducing the spacing between said support and said electrical device.

8. The structure of claim 1 wherein each of said contacts comprises a beam and said contacting portion.

9. The structure of claim 8 wherein said contacting portion is proximate an end of said beam.

10. The structure of claim 1 wherein each of said contacts is electrically connected to a corresponding flexible conductor.

11. The structure of claim 10 wherein each flexible conductor extends into a central region of said elastic membrane.

12. The structure of claim 1 further comprising a pressure control mechanism including a compressible member interposed between each contact and a support.

13. The structure of claim 12 further comprising a motion control mechanism locally operating in respect to each contact.

14. The structure of claim 13 further comprising a pressure control mechanism including a compressible member interposed between each contact and a support wherein said compressible member enables each beam to recover from said tiling motion in a manner avoiding mechanical straining of each contact.

15. The structure of claim 1 wherein each one of said contacts is tiltable independently of the other ones of said contacts.

16. The structure of claim 1 wherein said tilting motion is a result of parallel relative motion between a plane of said second surface of said elastic membrane and a plane of said electrical device.

17. The structure of claim 1 wherein said contacts are non-upright.

18. A structure suitable for use with a probe for probing an electrical device, said structure comprising a plurality of rigid contacts each of which defines a surface backed by a resilient pad and a contacting portion which is spaced apart from a midpoint of a length of said surface and spatially arranged for engagement with said electrical device, said contact pivoting about an axis of moment when said contacting portion is pressed into engagement with said electrical device and a restoring force is exerted on said surface by said resilient pad, said pivoting of said contact producing lateral movement of said contacting portion across said electrical device.

19. The structure of claim 18 wherein said contacts are asymmetrical.

20. The structure of claim 18 wherein said resilient pad comprises an elastic membrane in an overlying relationship to a support.

21. The structure of claim 20 wherein said support is made of incompressible material.

22. The structure of claim 20 wherein said support comprises a rigid material.

23. The structure of claim 20 wherein said elastic membrane has a central region positioned in said overlying relationship to said support.

24. The probe of claim 20 wherein the distance of said lateral scrubbing movement of each contact after touchdown of each contacting portion is dependent for each contact on the distance traveled after touchdown in reducing the spacing between said support and said electrical device.

25. The structure of claim 18 wherein said contact comprises said contacting portion and a beam including said surface.

26. The structure of claim 25 wherein said contacting portion is proximate an end of said beam.

27. The structure of claim 18 wherein each of said contacts is electrically connected to a corresponding flexible conductor.

28. The structure of claim 27 wherein each flexible conductor extends into a central region of an elastic membrane.

29. The structure of claim 18 further comprising a pressure control mechanism including a compressible member interposed between each contact and a support.

30. The structure of claim 29 further comprising a motion control mechanism locally operating in respect to each contact.

31. The structure of claim 30 further comprising a pressure control mechanism including a compressible member interposed between each contact and a support wherein said compressible member enables each contact to recover from said pivoting motion in a manner avoiding mechanical straining of each contact.

32. The structure of claim 18 wherein each one of said contacts is operable to pivot independently of the other ones of said contacts.

33. The structure of claim 18 wherein said pivoting motion is a result of parallel relative motion between a plane defining a support for said structure and a plane of said electrical device.

34. The structure of claim 18 wherein said contacts are non-upright.

\* \* \* \* \*